(12) United States Patent
Nomura et al.

(10) Patent No.: US 6,614,817 B2
(45) Date of Patent: Sep. 2, 2003

(54) LASER APPARATUS

(75) Inventors: Yoshinori Nomura, Tokyo (JP); Tetsuya Nishimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 40 days.

(21) Appl. No.: 09/864,331

(22) Filed: May 25, 2001

(65) Prior Publication Data

US 2002/0057720 A1 May 16, 2002

(30) Foreign Application Priority Data

Sep. 14, 2000 (JP) ........................................ 2000-279529

(51) Int. Cl.⁷ ............................ H01S 3/098; H01S 5/00; H01S 3/10
(52) U.S. Cl. ............................. 372/18; 372/50; 372/20
(58) Field of Search ............................. 372/10, 11, 18, 372/20, 43, 44, 64, 50

(56) References Cited

U.S. PATENT DOCUMENTS

| | | | | |
|---|---|---|---|---|
| 4,446,557 A | * | 5/1984 | Figueroa | 372/45 |
| 4,558,449 A | * | 12/1985 | Gordon | 372/44 |
| 4,896,325 A | * | 1/1990 | Coldren | 372/20 |
| 4,971,415 A | * | 11/1990 | Hara et al. | 385/14 |
| 5,088,097 A | * | 2/1992 | Ono et al. | 372/20 |
| 5,155,736 A | * | 10/1992 | Ono et al. | 372/20 |
| 5,274,649 A | * | 12/1993 | Hirayama et al. | 372/20 |
| 5,715,268 A | * | 2/1998 | Lang et al. | 372/50 |
| 6,031,851 A | * | 2/2000 | Shimizu et al. | 372/18 |
| 6,031,859 A | * | 2/2000 | Nambu | 372/50 |
| 6,031,860 A | * | 2/2000 | Nitta et al. | 372/50 |
| 6,510,167 B1 | * | 1/2003 | Jain et al. | 372/6 |
| 6,542,522 B1 | * | 4/2003 | Arahira | 372/18 |

OTHER PUBLICATIONS

Ogura et al.; "Precise SDH frequency operation of monolithic modelocked laser diodes with frequency turning function", *Electronics Letters*, Jul. 22, 1999, pp. 1275–1277, vol. 35, No. 15.

Yokoyama et al.; "All–Optical Signal Processing with Mode–locked Semiconductor Lasers", *The Institute of Elec. Information and Communication Engineers*, Symposium on "Road to All–Optical Implementation", Mar. 13, 2000.

Arahira et al.; "Mode–Locking at Very High Repetition Rates... Laser Diodes", *J. of Quantum Elec.*, Jul. 1996, pp. 1211–1224, vol. 32, No. 7.

Lamb, Willis E., Jr.; "Theory of an Optical Maser", *Physical Review*, Jun. 15, 1964, pp. A1429–A1450, vol. 134, No. 6A.

Sargent III, et al.; "Multimode Operation", *Laser Physics*, 1974, pp. 114–133, Addison–Wesley Pub. Co., Inc., Reading, MA.

Haug et al.; "Quantum Theory of the Optical and Electronic Properties of Semiconductors", 1990, pp. 74–89, World Scientific Publishing Co., London, England.

(List continued on next page.)

*Primary Examiner*—Paul Ip
*Assistant Examiner*—Phillip Nguyen
(74) *Attorney, Agent, or Firm*—Leydig, Voit & Mayer, Ltd.

(57) ABSTRACT

A laser apparatus includes a resonator and an excitation source for gain section excitation. The resonator includes a gain section in which a population inversion is obtained by optical excitation or current injection, non-gain sections in which gain with respect to a laser oscillating light beam is not positive, and two reflection mirrors. The gain section has an optical path length approximately one half that of the resonator and placed centrally with respect to the optical axis of the resonator. The non-gain sections are arranged on opposite sides of the gain section. The two reflection mirrors are arranged further beyond the non-gain sections.

20 Claims, 13 Drawing Sheets

OTHER PUBLICATIONS

Agrawal et al.; "Long–Wavelength Semiconductor Laser", 1986, pp. 84–85, Van Nostrand Reinhold Co., Inc., New York, NY.

Chow et al.; Carrier Correlation Effects in a Quantum–Well Semiconductor Laser Medium, *IEEE J. of Selected Topics in Quantum Elec.*, Apr. 1997, pp. 136–141, vol. 3, No. 2.

Nomura et al.; "Mode–Locking Operation of Fabry–Perot . . . ". *Technical Report of IEICE*, 1999.

Nomura et al.; "Stable Mode–Locking Operation . . . Wavelength", *The 6$^{th}$ Intl. Workshop on Femtosecond Tech.*, Jul. 13–15, 1999, p. 90, Chiba, Japan.

Born et al.; Principles of Optics, 1970, pp. 50–70, Pergamon Press, Bath England.

Chow et al.; "Two–mode Bidirectional Ring–Laser Operation", 1994, pp. 322–327, Springer–Verlag Berlin Heidelberg, USA.

* cited by examiner

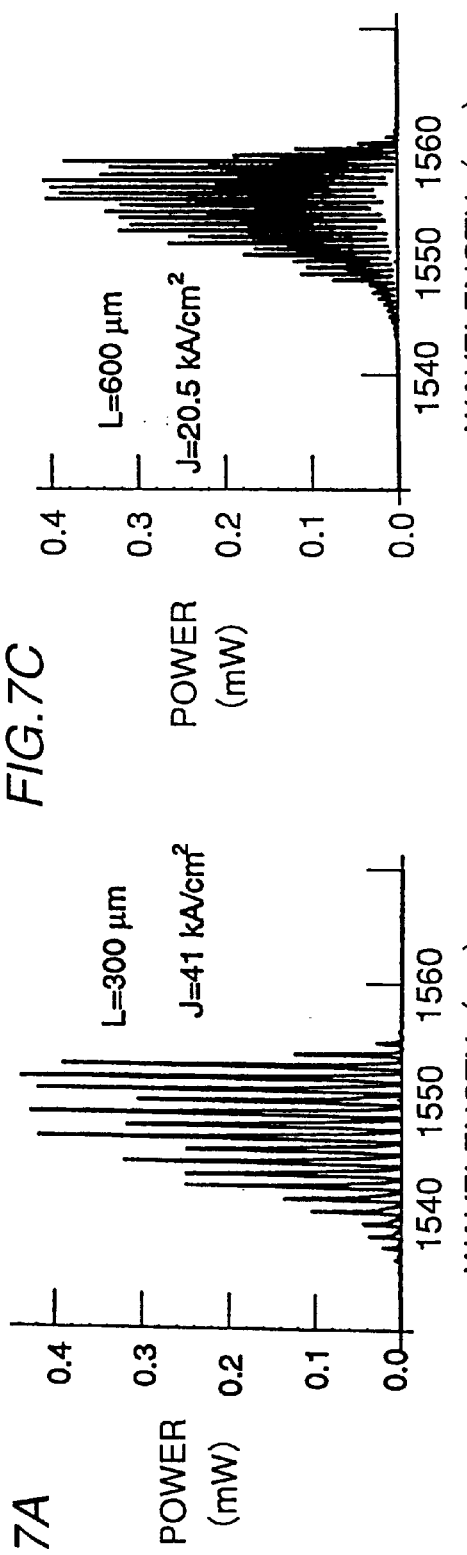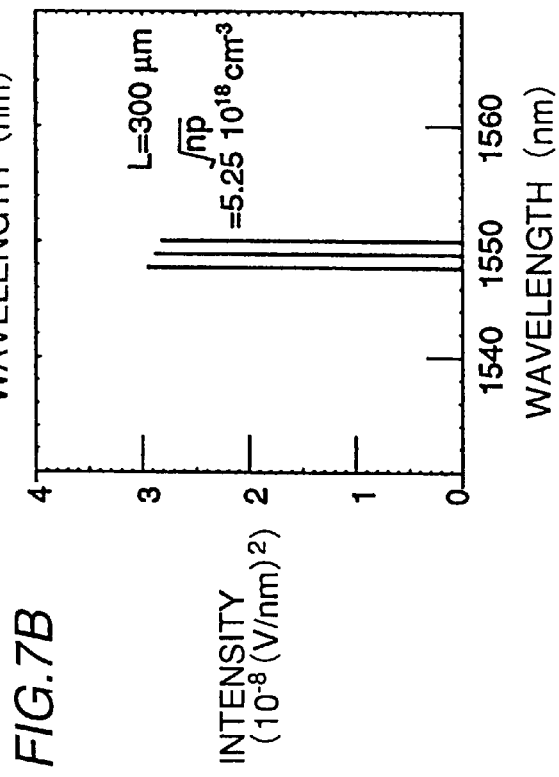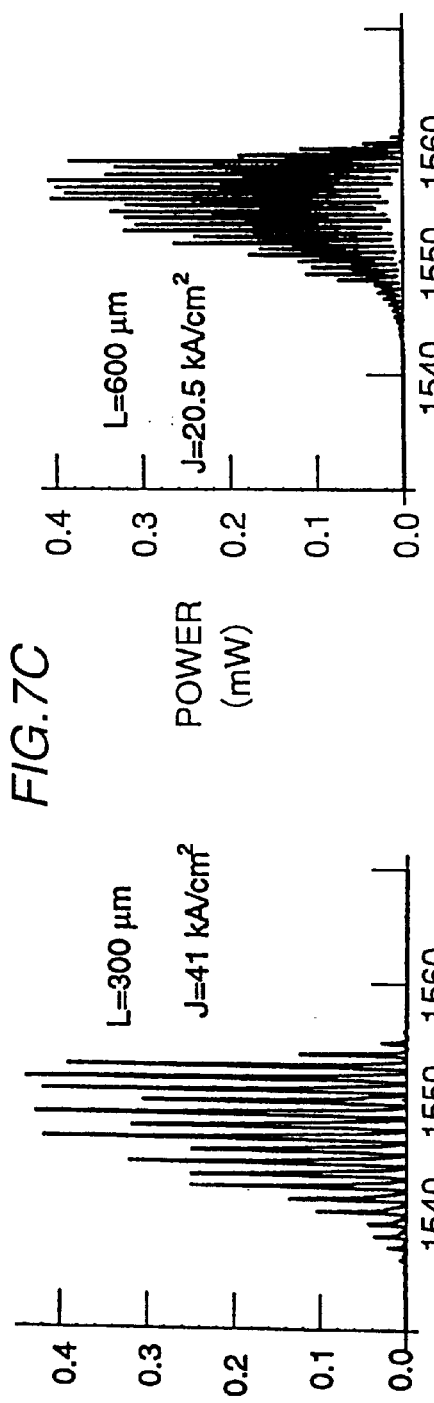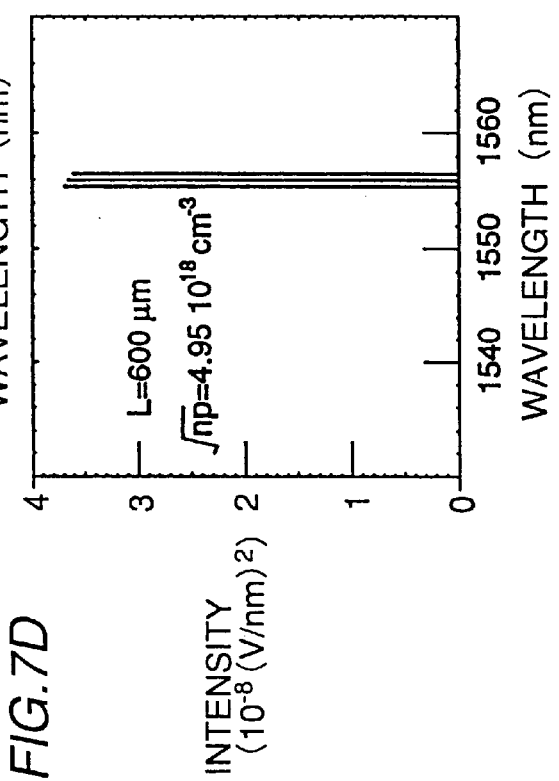

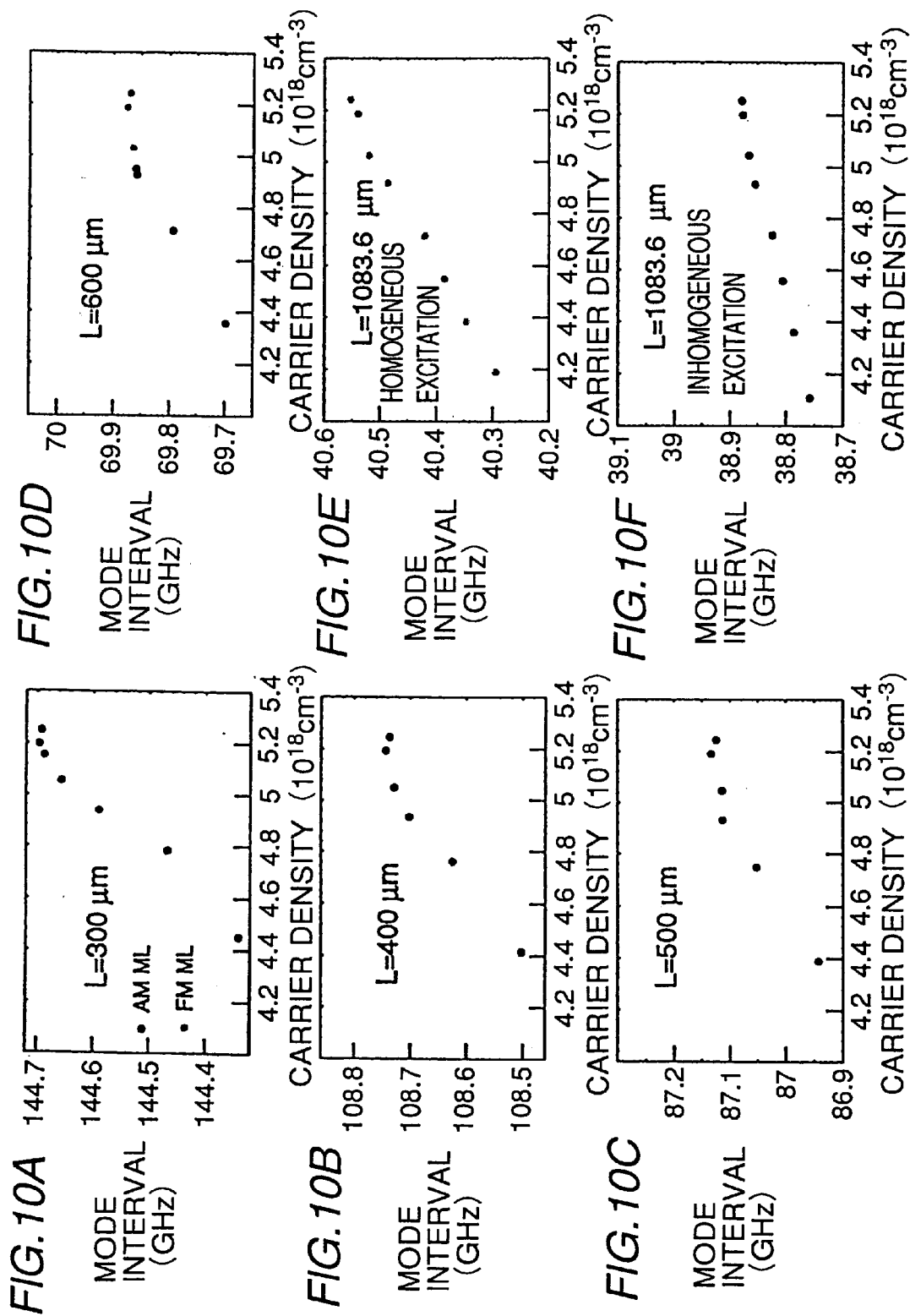

LASER APPARATUS

BACKGROUND OF THE INVENTION

1. Field of the Invention

The present invention relates to a laser apparatus and, more specifically, to a mode-locked type laser apparatus.

2. Description of the Background Art

As the total capacity of transmission has been rapidly increasing recently, in the field of optical fibers, increase of the transmission rate per unit wavelength has been desired as an approach for practical implementation of ultra high speed/ultra large capacity optical transmission. For this purpose, in order to realize optical transmission at a rate of exceeding 100 Gbps per unit wavelength in the near future, mode-locking semiconductor laser diodes (MLLD) have been studied. The mode-locked state includes two different types, that is, amplitude modulation mode locking (AMML) and phase (frequency) modulation mode locking (FMML). In the AMML, all modes oscillate in-phase, and therefore a high energy optical pulse can be obtained. In the FMML, of the oscillating modes, some are oscillating out-of-phase, and therefore, a high energy optical pulse cannot be obtained. Therefore, laser oscillation of AMML is desired in order to obtain a high energy optical pulse. In order to realize ultra high speed and ultra large capacity optical transmission, no matter what repetition frequency is necessary, an AMML laser device that operates at that frequency is desired.

One example of the study of MLLD is disclosed in "All-Optical Signal Processing with Mode-Locked Semi-conductor Lasers", Yokoyama et. al., Proceedings of a symposium by The Institute of Electronics Information and Communication Engineers. The MLLD described by Yokoyama et. al. is adapted to have a saturable absorption effect within the device, whereby basic optical signal processing function as a coherent pulse light source, optical clock extraction, optical gate, as well as optical 3R identification reproduction (3R: retiming, reshaping, regenerating) and optical time division demultiplexing (optical DEMUX) can be attained by a simple arrangement. In the MLLD technique by Yokoyama et. al., mentioned above, however, a saturable absorption section is necessary within the laser cavity. Therefore, an operational instability, such as hysteresis of the light-current characteristic, is a serious problem for the device. Further, the threshold current is high undesirably.

Therefore, an object of the present invention is to provide a laser apparatus not requiring the saturable absorption section and in which modes all oscillate in a mode-locked manner with constant phase differences regardless of the oscillating condition, that is, a laser apparatus that oscillates in AMML.

SUMMARY OF THE INVENTION

The above described object of the present invention is attained by the laser apparatus by the present invention, which includes a resonator and a gain section excitation means wherein the resonator includes a gain section in which population inversion is attained by at least one method selected from the group consisting of optical excitation and current injection, non-gain sections in which gain with respect to the laser oscillating light beam is not positive, and two reflection mirrors. The gain section is arranged at a central portion along the optical axis of the resonator, to have the optical path length approximately one half that of the resonator. The non-gain sections are arranged on both sides of the gain section along the optical axis of the resonator. The two reflection mirrors are arranged further outside of the non-gain sections along the optical axis of the resonator. The gain section excitation means is for retaining the excited state of the gain section.

By the above described arrangement, it becomes possible to obtain AMML oscillation even in a laser apparatus having such a resonator length that causes FMML oscillation when the inner portion as a whole of the resonator is used as the gain section.

In the above described invention, preferably, the gain section includes a semiconductor, and the non-gain section includes a dielectric. Alternatively, the gain section includes a semiconductor and the non-gain section includes a semiconductor. By this arrangement, even in a semiconductor laser device, an arrangement that can attain AMML oscillation can be realized easily.

In the above described invention, preferably, a non-gain section electrode is provided, which performs carrier injection to the non-gain section or application of a reverse bias to the non-gain sections. In this arrangement, it becomes possible to inject carriers to an optical wave guide layer by using the non-gain section electrode and, as a result, index of refraction within the resonator changes because of the plasma effect of free carriers, controlling substantial optical path length. Alternatively, by applying the reverse bias, the substantial optical path length can be controlled. Accordingly, repetition frequency of the mode locked optical pulse can be controlled.

In the above described invention, preferably, at least one of the reflection mirrors is a distributed Bragg reflector. By this arrangement, it becomes possible to select the oscillation wavelength of the mode locked laser, and expansion of the oscillation spectrum can be limited.

In the above described invention, preferably, a distributed Bragg reflector electrode is provided, for changing reflection spectrum by current injection or reverse bias application to a periodic structure of the distributed Bragg reflector. When this arrangement is employed, it becomes possible to change the reflection spectrum of the distributed Bragg reflector and to change the wavelength of the mode locked optical pulse.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7A is a graph representing a spectrum when a semiconductor laser having a resonator length of 300 μm is pulse-driven with a current density of 41 kA/cm$^2$.

FIG. 7B is a graph representing spectra of three modes obtained as calculation results.

FIG. 7C is a graph representing the result of an experiment with a laser having a resonator length of 600 μm.

FIG. 7D is a graph representing the results of calculation of the laser having the resonator length of 600 μm.

FIGS. 10A to 10F are graphs representing carrier density dependency of mode intervals, obtained as results of calculations for various resonator lengths and resonator configurations.

DESCRIPTION OF THE PREFERRED EMBODIMENTS (First Embodiment)

Figure 1:
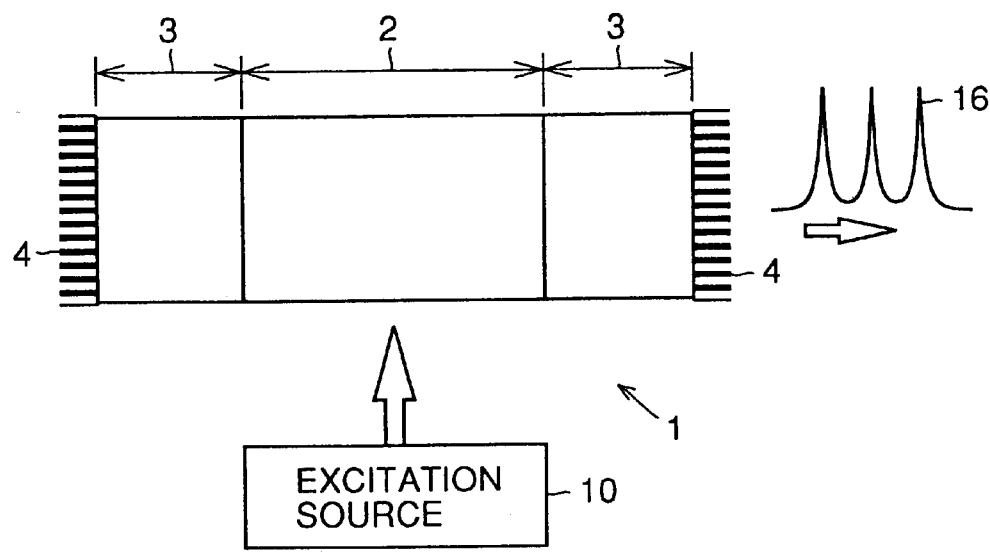
FIG. 1 is a schematic diagram of the apparatus in accordance with the first embodiment of the present invention.

Referring to FIG. 1, the arrangement of the laser apparatus in accordance with the first embodiment of the present invention is described below. The laser apparatus includes a resonator 1 and an excitation source 10 as a means for excitation of the gain section. Resonator 1 includes reflection mirrors 4 at both ends in the direction of the optical axis (left-right direction in FIG. 1), and at the portion between the reflection mirrors 4, there are a gain section 2 and non-gain sections 3, as shown in FIG. 1. Here, "gain section" means a section at which population inversion is obtained by optical excitation or injection of current, and "non-gain section" means a section in which the gain with respect to the laser oscillating light beam is not positive. More specifically, the non-gain section means a section that is either transparent or slightly absorptive to the laser light. An interposed layer of air, for example, is also applicable to the non-gain section.

As shown in FIG. 1, the central portion is the gain section 2 and opposing sides are the non-gain sections 3. Further, on the opposing sides thereof, two reflection mirrors are arranged. The length of gain section 2 must be at least 8% of the length of resonator 1 along the optical axis (hereinafter referred to as "resonator length"). Further, it should desirably be at most 50%. At least one of the reflection mirrors is capable of partially transmitting the light beam. It is desirable that reflection at an interface between the gain section 2 and the non-gain section 3 is suppressed as much as possible.

For the case that the inner portion of the resonator is fulfilled with a uniform gain section 2, oscillation starts when gain section 2 is excited. In that case, oscillation occurs in the mode locked state without exception. As at least one of the reflection mirrors 4 can partially transmit the light beam, mode locked optical pulses 16 are emerged from one of the reflection mirrors 4. Here, as described above, there are two different types of mode-locked state, that is, AMML and FMML, and the oscillation mentioned above occurs in either one of mode-locked states.

If oscillation occurs in FMML with the gain section 2 occupying the entire inner portion of resonator 1, oscillation in AMML inevitably occurs by adapting the gain section 2 such that the length of the gain section 2 is shortened to a half of the resonator length and the position is at the center of the resonator 1. To the contrary if oscillation in AMML occurs with the gain section 2 occupying an entire inner portion of the resonator 1, oscillation in FMML inevitably occurs by adapting the gain section 2 such that the length of the gain section 2 is shortened to a half of the resonator length and the position is at the center of the resonator 1. Therefore, by selecting the arrangement of gain section 2, a laser apparatus that oscillates in AMML can be realized.

Therefore, the arrangement in accordance with the present invention is proposed as an arrangement to attain AMML oscillation, even in a laser apparatus having such a resonator length that causes FMML oscillation, when the entire inner portion of resonator 1 is used as the gain section 2.

(Second Embodiment)

Figure 2:
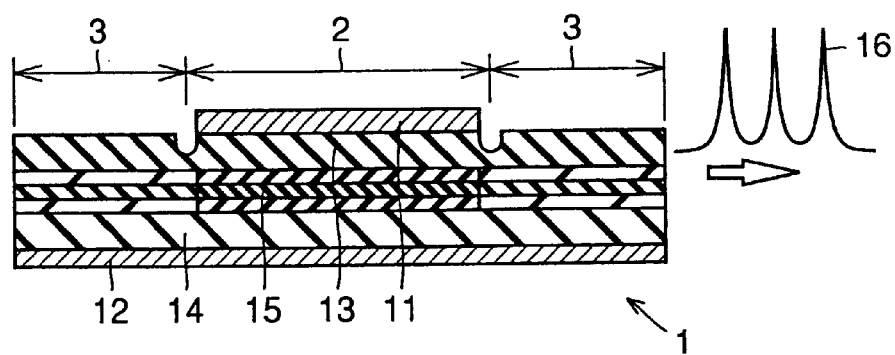
FIG. 2 is a cross sectional view of the laser apparatus in accordance with the second embodiment of the present invention.

With reference to FIG. 2, the laser apparatus, that is the second embodiment of the present invention will be described. The laser apparatus is formed basically following the arrangement of the first embodiment, however, specifically it consists of semiconductor materials. As shown in FIG. 2, a negative electrode 12 is formed on a lower surface entirely along the resonator. On negative electrode 12, an n clad layer 14 is formed, and on n clad layer 14, a p clad layer 13 is formed. In gain section 2, the portion sandwiched between n clad layer 14 and p clad layer 13 serves as an active section 15. In the gain section 2, a positive electrode 11 is formed on p clad layer 13. Therefore, in this example, both the gain section 2 and the non-gain sections 3 consists of semiconductor materials. The non-gain sections 3, however, can be a dielectric material. The length of gain section 2 is limited to one half the length of resonator length and the gain section is arranged at the center of resonator 1.

When a first potential is applied to the positive electrode 11 and a second potential lower than the first potential is applied to the negative electrode 12 simultaneously, the gain section 2 attains to the excited state, laser oscillation starts, and a mode locked optical pulse 16 is generated.

Even when the laser apparatus has such a laser resonator length that causes FMML oscillation when the entire inner portion of the resonator serves as the gain section, AMML oscillation can be attained if the gain section 2 is arranged in the above described manner. When the resonator length is long, oscillation tends to be in FMML when the entire inner portion of the resonator is used as the gain section. Even in that case, however, AMML oscillation can be attained when the gain section 2 is arranged in the above described manner.

The reason why the arrangement of gain section 2 in the first and second embodiments results in AMML oscillation is clarified by numerical analysis of mode lock generation conditions, taking a quantum well semiconductor laser as an example. Therefore, a numerical formula model used for the numerical analysis will be described, and the results of numerical analysis using the single quantum well laser as the model will also be described.

Though the single quantum well semiconductor laser is used as the model here, the effect of the present invention can also be attained in multiple quantum well semiconductor lasers. Further, the effect of the present invention can be attained by semiconductor lasers having double heterojunction structures.

(Numerical Analysis)

Here, the condition for mode lock generation in the quantum well semiconductor laser will be numerically analyzed. In order to find the conditions for mode lock generation, it is necessary to assume a situation where at least three adjacent modes oscillate simultaneously. Here, coupling mode equations for amplitude and phases, including up to third order perturbation term of the electric field is used. Such coupling mode equations can be derived from Maxwell's equations, on the assumption that the respective mode amplitudes vary slowly. (W. E. Lamb, Jr., Phys. Rev., 134, A1429 (1964), M. Sargent, III, M. O Scully and W. E. Lamb, Jr., Laser Physics, (Addison-Wesley, Tokyo, 1974)). Polarization included in Maxwell's equations is determined by the electronic state in the active section of the semiconductor laser of interest. In a semiconductor laser, the main source of polarization is 2 dimensional (2D) free carrier transitions in the quantum well. In the semiconductor laser, carriers are excited through current injection. It is assumed that a quasi-equilibrium state is established in the excited state. Hence, the electron and hole densities in the quantum well are defined and rate equations thereof can be derived. (H. Haug and S. W. Koch, Quantum Theory of the Optical and Electronic Properties of Semiconductors, Third Edition, (World Scientific, New Jersey, 1998)). The rate equation and the coupling mode equations of the electric field amplitudes and phases described above determine the operation of the semiconductor laser. Therefore, conditions for generating ML is also determined by these expressions.

Particularly, conditions for AMML generation are described by two simple inequality relations derived from the equations of motion of the phase. The inequality relations are formally the same as those for two-level systems derived by Lamb and Sargent.

In a laser, 2D free carriers are supplied by the current to the quantum well. The supply process is calculated, by assuming the drift diffusion model, and solving simultaneously the continuity equation of 3-dimensional Poisson's equation. In the quantum well section, a trap time of 3D carriers to 2D carriers and escape time of 2D carriers to 3D carriers are assumed, and thus the continuity equation of 3D carriers and rate equation of 2D carriers are combined. Thus net 2D carrier density is determined.

The specific single quantum well laser will be taken as the model, and conditions for AMML generation will be studied numerically on the base of the formulation described above.

(A. Formulation)

(A. 1 Maxwell Wave Equation)

The starting point is Maxwell's wave equation. The following discussion will be focussed only on TE (Transverse Electric) modes, because most of semiconductor lasers oscillate in this mode. The discussion can readily be extended to TM (Transverse Magnetic) mode. From the Maxwell's equations, the following wave equation for the electric laser field $\in$ within the resonator is derived.

$$\left\{ -\left( \frac{\partial^2}{\partial y^2} + \frac{\partial^2}{\partial z^2} \right) + \mu_0 \sigma \frac{\partial}{\partial t} + \mu_0 \varepsilon_0 \frac{\partial^2}{\partial t^2} \right\} \varepsilon = -\mu_0 \frac{\partial^2 p}{\partial t^2} \quad (1)$$

where $\in_0$ represents the dielectric constant of vacuum, $\mu_0$ represents the permeability of vacuum, and $\sigma$ is a constant representing the amount of electromagnetic energy dissipating from the resonator to the outside. P is a polarization self-consistent with the electric field $\in$ of the laser. In the equation (1), it is assumed that the field is homogenous in the x direction. The z direction is the axial direction of the resonator. The laser electric field oscillating in multi-mode can be expanded by normal modes of the resonator, as follows, $$\varepsilon(y, z, t) = \frac{1}{2}\sum_n E_n(t)\exp\{-i(\nu_n t + \phi_n)\}Y_n(y)Z_n(z) + c.c. \qquad (2)$$

Here $Y_n(y)$ is the unnormalized and dimensionless electric field distribution function in the y direction of a guided wave. When the distribution of the refractive index of the laser structure (and therefore, specific susceptibility $\chi(y)$) is known, it can be obtained by solving the equation (1), substituting $P = \in_0 \chi(y) \in$, and $\sigma = 0$. $Z_n(z)$ represents z dependency of the unnormalized normal mode, which is as follows:

$$Z_n(z) = \sin \beta_n z \qquad (3)$$

where $\beta_n$ is given by $$\beta_n = n\pi/L \qquad (4)$$

Similarly, polarization P in the resonator can be represented by the following equation.

$$P(z, t) = \frac{1}{2}\sum_n P_n(t)\exp\{-i(\nu_n t + \phi_n)\}Y_n(y)Z_n(z) + c.c. \qquad (5)$$

In the equation (2), $E_n$, $Y_n$ and $Z_n$ are considered as real without losing generality. Therefore, $\in$ is real, whereas P is imaginary. The real component of P oscillates in the same phase as $\in$, and the imaginary component is shifted in phase by 90°. By inputting equations (2) and (5) into the equation (1), projecting to $Z_n(z)$ and by approximation in which a term smaller than the quadratic differential of the electric field and polarization with respect to time is neglected, the following equations can be obtained.

$$\dot{E}_n + \frac{1}{2}\frac{\nu_n}{Q_n}E_n = -\frac{1}{2}\frac{\nu_n}{\varepsilon_o}\text{Im}(P_n) \qquad (6)$$

$$\nu_n + \dot{\phi}_n = \Omega_n - \frac{1}{2}\frac{\nu_n}{\varepsilon_o}E_n^{-1}\text{Re}(P_n) \qquad (7)$$

In deriving equations (6) and (7), the wave number and the frequency proper to the resonator are defined. Namely, $$K_n^2 \equiv -\frac{1}{Y_n}\frac{d^2 Y_n}{dy^2} + \beta_n^2 \qquad (8)$$

$$\Omega_n = cK_n \qquad (9)$$

Here, c represents the speed of light. As the amount representing dissipation of light, the following quality factor $Q_n$ is introduced, in place of $\sigma$.

$$\sigma = \varepsilon_0 \frac{\nu_n}{Q_n} \qquad (10)$$

(A. 2 Equation of Light and Free Carriers in the Active Section)

Dipole moment associated with free carrier transition in the semiconductor is dominate the polarization in equations (6) and (7). A single particle density matrix with respect to the state k of free carriers is represented by the following equation.

$$\rho_k(t) = \sum_{\lambda',\lambda} \rho_{\lambda',\lambda,k}(t)|\lambda',k\rangle\langle\lambda,k| \qquad (11)$$

Here, c represents a conduction band and v represents a valence band. Each component of the density matrix follows the following equation of motion under a perfect k conservation.

$$\dot{\rho}_{cck} = \xi_{ck} - \gamma_{ck}\rho_{cck} + i\hbar^{-1}\in(t)(d_{cvk}\rho_{vck} - d_{vck}\rho_{cvk}) \qquad (12)$$

$$\dot{\rho}_{vvk} = \xi_{vk} - \gamma_{vk}\rho_{vvk} - i\hbar^{-1}\in(t)(d_{cvk}\rho_{vck} - d_{vck}\rho_{cvk}) \qquad (13)$$

$$\dot{\rho}_{cvk} = (\gamma + i\omega_k)\rho_{cvk} - i\hbar^{-1}\in(t)d_{cvk}(\rho_{cck} - \rho_{vvk}) \qquad (14)$$

Here, $d_{cvk}$ represents matrix element of the dipole moment, $\xi_{ck}$ ($\xi_{vk}$) represents the excitation rate of the carriers to the state k of the conduction band (valence band). Further, $\gamma_{ck}$ and $\gamma_{vk}$ represent damping rates from the state k of the conduction band (valence band).

$\gamma$ in equation (14) is given as $$\gamma = \frac{1}{2}(\gamma_{ck} + \gamma_{vk}) + \gamma_{ph} \qquad (15)$$

Here, $\gamma_{ph}$ represents a phase relaxation constant, and $\omega_k$ represents energy between transition levels.

$$\omega_k = \omega_{ck} - \omega_{vk} \qquad (16)$$

(A. 3 Polarization)

Polarization represented by using the components of the density matrix and the matrix components of the dipole moment is as follows.

$$P = \frac{1}{V}\sum_k (\rho_{cvk}d_{vck} + \rho_{vck}d_{cvk}) \qquad (17)$$

$$= \frac{1}{V}\sum_k \rho_{cvk}d_{vck} + c.c. \qquad (18)$$

In equation (18), V represents volume of the active section of the laser. Equating the corresponding complex conjugate components in equations (18) and (5) and projecting to $Z_n$, we obtain the following equation for the polarization component $P_n$ of the mode n.

$$P_n(t) = \frac{2e^{i(\nu_n t + \phi_n)}}{VM_n N_n}\sum_k \int_{-\infty}^{\infty} Y_n^*(y)dy \int_0^L \rho_{cvk}d_{vck}Z_n^*(z)dz \qquad (19)$$

where $$M_n = \int_{-\infty}^{\infty} |Y_n|^2 dy \qquad (20)$$

$$N_n = \int_0^L |Z_n|^2 dz \qquad (21)$$

By representing the density matrix component in equation (19) in terms of the electric field and substituting equation (19) to equations (7) and (6), we obtain equations of motion for the electric field amplitudes and the phases that are consistent with the electron system. Then, the next step is to solve equations (12), (13) and (14). In these equations, the term including the electric field $\in$ is considered to be a perturbation. The solution can be expanded by a series of electric field, to the following form. Here, up to the third order perturbation term will be solved.

$$\rho(t) = \rho^{(0)}(t) + \rho^{(1)}(t) + \rho^{(2)}(t) + \rho^{(3)}(t) + \ldots \quad (22)$$

(A. 4 0th Order Term of Density Matrix)

Now, $\rho^{(0)}(t)$ is the term not including the electric field. The term represents the initial state of the electron system when the interaction between electrons and fields starts. Integrating formally equation (12) with assumption of $\in = 0$ we obtain, $$\rho_{cck}^{(0)} = \xi_{ck} \gamma_{ck}^{-1} \quad (23)$$

This equation represents the probability of electrons occupying the state k in the conduction band. As a quasi thermal equilibrium state is considered here, this equation can also be represented as $$\rho_{cck}^{(0)} = \frac{1}{\exp\{(\hbar\omega_{ck} - \mu_c)/kT\} + 1} \quad (24)$$

where $\mu_c$ represents quasi-Fermi energy in the conduction band, and the value is determined so as to provide the number of carriers in the conduction band, when the equation (24) is summed up for every level. More specifically, the following equation holds.

$$n_e V = \sum_k \frac{1}{\exp\{(\hbar\omega_{ck} - \mu_c)/kT\} + 1} \quad (25)$$

where $n_e$ represents free electron density in the conduction band, and V represents the volume of the system.

Similarly, $\rho^{(0)}_{vvk}$ obtained by integrating the equation (13) under the condition of $\in = 0$ represents probability of electrons occupying the state k in the valence band. Now, for the valence band, let us consider not the electrons but holes. We represent distribution function of the holes as follows.

$$\frac{1}{\exp\{(\hbar\omega_{vk} - \mu_v)/kT\} + 1} \quad (a)$$

Then, the expression related to $\rho^{(0)}_{vvk}$ and the hole density can be given as follows.

$$\rho_{vvk}^{(0)} = 1 - \frac{1}{\exp\{(\hbar\omega_{vk} - \mu_v)/kT\} + 1} \quad (26)$$

$$pV = \sum_k \frac{1}{\exp\{(\hbar\omega_{vk} - \mu_v)/kT\} + 1} \quad (27)$$

Here, p represents hole density in the valence band, and $\mu_v$ represents quasi-Fermi energy in the valence band.

(A. 5 First Order Term of Density Matrix)

By substituting equations (24) and (26) for $(\rho^{(0)}_{cck} - \rho^{(0)}_{vvk})$ in equation (14) and integrating the equation in consideration of the equation (2), the following expression related to $\rho^{(1)}_{cvk}$ can be obtained, under rotational wave approximation.

$$\rho_{cvk}^{(1)} = -\frac{1}{2} i\hbar^{-1} d_{cvk} N_k(z,t) \sum_\sigma E_\sigma(t) \exp\{-i(\nu_\sigma t + \phi_\sigma)\} \quad (28)$$

$$Y_\sigma(y) Z_\sigma(z) D(\omega_k - \nu_\sigma)$$

where $$N_k(z,t) \equiv \rho_{cck}^{(0)} - \rho_{vvk}^{(0)} \quad (29)$$

The right hand side depends on neither z nor t when a semiconductor laser itself is considered. When the inner portion of the resonator is to be partially excited as will be discussed later, $N_k$ depends on z and t. Further, there is the following relation.

$$D_x(\Delta\omega) \equiv 1/(\gamma_x + i\Delta\omega), \quad x = ck, vk, \text{ or no sign} \quad (30)$$

When the equation (28) is to be derived, it is considered that $$E_\sigma, \phi_\sigma, N_k \quad (b)$$

hardly changes within the time range of $1/\gamma$, and therefore this is placed outside of integration (rate equation approximation).

(A. 6 Second Order Term of Density Matrix)

By substituting equation (28) into equation (12), using $$\rho_{cvk} = \rho_{vck}^* \quad (31)$$

$$d_{cv} = d_{vc}^* \quad (32)$$

the following equation can be obtained.

$$\dot{\rho}_{cck} = \xi_{ck} - \gamma_{ck}\rho_{cck} - \frac{1}{4}\left(\frac{d_{cvk}}{\hbar}\right)^2 N_k \times \quad (33)$$

$$\sum_\rho \sum_\sigma E_\rho E_\sigma Y_\rho^* Y_\sigma Z_\rho^* Z_\sigma D(\omega_k - \nu_\sigma) \times$$

$$\exp[i\{(\nu_\rho - \nu_\sigma)t + \phi_\rho - \phi_\sigma\}] + c.c.$$

By integrating this equation, we have $$\rho_{cck}^{(2)} = -\frac{1}{4}\left(\frac{d_{cvk}}{\hbar}\right)^2 N_k \times \sum_\rho \sum_\sigma E_\rho E_\sigma Y_\rho^* Y_\sigma Z_\rho^* Z_\sigma D(\omega_k - \nu_\sigma) \quad (34)$$

$$D_c(\nu_\rho - \nu_\sigma) \exp[i\{(\nu_\rho - \nu_\sigma)t + \phi_\rho - \phi_\sigma\}] + c.c.$$

where it is assumed that mode amplitude and the phase hardly change in $1/\gamma_c$. By substitution of $\gamma_{cck} \to \gamma_{vvk}$, the following equation is obtained.

$$\rho_{vvk}^{(2)} = -\rho_{cck}^{(2)} \quad (35)$$

From equations (34) and (35), we have the following relation.

$$\rho_{cck}^{(2)} - \rho_{vvk}^{(2)} = -\frac{1}{4}\left(\frac{d_{cvk}}{\hbar}\right)^2 N_k \times \sum_\rho \sum_\sigma E_\rho E_\sigma Y_\rho^* Y_\sigma Z_\rho^* Z_\sigma \quad (36)$$

$$\exp[i\{(\nu_\rho - \nu_\sigma)t + \phi_\rho - \phi_\sigma\}] \times \{D(\omega_k - \nu_\sigma) +$$

$$D^*(\omega_k - \nu_\rho)\}\{D_c(\nu_\rho - \nu_\sigma) + D_\nu(\nu_\rho - \nu_\sigma)\}$$

As can be seen from the equation (36), there appears a beat between the modes in the excitation distribution ("population pulsation").

(A. 7 Third Order Term of Density Matrix)

By substituting the equations (36), (24) and (26) to equation (14), and solving equation (14) the following equation results.

$$\rho_{cvk}^{(3)} = \frac{\iota}{8}\left(\frac{d_{cvk}}{\hbar}\right)^3 N_k \times \qquad (37)$$

$$\sum_\mu \sum_\rho \sum_\sigma E_\mu E_\rho E_\sigma Y_\mu^* Y_\sigma Z_\mu Z_\rho^* Z_\sigma$$

$$\exp\{\iota(-\nu_\mu + \nu_\rho - \nu_\sigma)t + \iota(-\phi_\mu + \phi_\rho - \phi_\sigma)\} \times$$

$$D(\omega_k - \nu_\mu + \nu_\rho - \nu_\sigma)\{D(\omega_k - \nu_\sigma) + D^*(\omega_k - \nu_\rho)\} \times$$

$$\{D_c(\nu_\rho - \nu_\sigma) + D_\upsilon(\nu_\rho - \nu_\sigma)\}$$

(A. 8 Mode Polarization)

By substituting equations (28) and (37) to equation (19), the expression of mode polarization up to the third order can be obtained. Now, it is assumed that $N_k$ has such a spatial dependency as follows.

$$N_k(y,z) = N_k S^y(y) S^z(z) \qquad (38)$$

By substituting the equation (28) to the equation (19), the first order term of mode polarization can be represented by $$P_n^{(1)}(t) = \frac{-\iota\hbar^{-1}}{VM_n N_n}\sum_\sigma E_\sigma(t)e^{\iota\{(\nu_n-\nu_\sigma)t+(\phi_n-\phi_\sigma)\}} \times \qquad (39)$$

$$\sum_k N_k (d_{cvk})^2 D(\omega_k - \nu_\sigma) S_{n\sigma}^y S_{n\sigma}^x$$

where $$S_{n\sigma}^y = \frac{1}{M_n}\int_{-\infty}^\infty Y_n^* Y_\sigma S^y dy \qquad (40)$$

$$S_{n\sigma}^x = \frac{1}{N_n}\int_0^L Z_n^* Z_\sigma S^z dz \qquad (41)$$

In equation (39), if $n \neq \sigma$, $P^{(1)}_n(t)$ has a component that oscillates at a frequency corresponding to the mode interval. We assume that the polarization and amplitude change slowly. (Fast oscillation component is included in the phase. This approximation is referred to as SVA approximation (slowly-varying-amplitude approximation)). In accordance with the assumption, terms with $n \neq \sigma$ are neglected.

$$P_n^{(1)}(t) = \frac{-\iota\hbar^{-1}}{V}E_n(t) \times \sum_k N_k(d_{cvk})^2 D(\omega_k - \nu_n)S_{nn}^y S_{nn}^z \qquad (42)$$

As to the third order term, the equation (37) is substituted to the equation (19), and integration related to z is evaluated first.

$$Z_n^* Z_\mu Z_\rho^* Z_\sigma = \frac{1}{8}[\cos\{(\beta_n - \beta_\mu + \beta_\rho - \beta_\sigma)z\} + \qquad (43)$$

$$\cos\{(\beta_n - \beta_\mu - \beta_\rho + \beta_\sigma)z\} + \cos\{(\beta_n + \beta_\mu - \beta_\rho - \beta_\sigma)z\}]$$

Further, also by SVA approximation, only those that satisfy the following equation are left.

$$\nu_n - \nu_\mu + \nu_\rho - \nu_\sigma \approx 0 \qquad (44)$$

Namely, $$n = \mu - \rho + \sigma \qquad (45)$$

As a result, among the equation (43), only the following term remains.

$$\frac{1}{8}[1 + \cos\{2(\beta_\sigma - \beta_\rho)z\} + \cos\{2(\beta_\mu - \beta_\rho)z\}] \qquad (46)$$

Therefore, the following equation is obtained, $$P_n^{(3)} = \frac{\iota}{32}\hbar^{-3}\sum_\mu\sum_\rho\sum_\sigma E_\mu E_\rho E_\sigma \exp(\iota\Psi_{n\mu\rho\sigma}) \times \qquad (47)$$

$$S_{n\mu\rho\sigma}^y S_{n\mu\rho\sigma}^z \{D_c(\nu_\rho - \nu_\sigma) + D_\upsilon(\nu_\rho - \nu_\sigma)\} \times$$

$$\sum_k N_k d_{cvk}^4 D(\omega_k - \nu_\mu + \nu_\rho - \nu_\sigma) D(\omega_k - \nu_\sigma) +$$

$$D^*(\omega_k - \nu_\rho)\}$$

where $$\Psi_{n\mu\rho\sigma} = (\nu_n - \nu_\mu + \nu_\rho - \nu_\sigma)t + \phi_n - \phi_\mu + \phi_\rho - \phi_\sigma \qquad (48)$$

$$S_{n\mu\rho\sigma}^y = \frac{1}{M_n}\int_{-\infty}^\infty Y_n^* Y_\mu Y_\rho^* Y_\sigma S^y dy \qquad (49)$$

$$S_{n\mu\rho\sigma}^z = \frac{1}{N_n}\int_0^L[1 + \cos\{2(\beta_\sigma - \beta_\rho)z\} + \cos\{2(\beta_\mu - \beta_\rho)z\}]S^z dz \qquad (50)$$

By combining equations (42) and (47), we obtain $$P_n(t) = P_n^{(1)}(t) + P_n^{(3)}(t) \qquad (51)$$

By substituting the equation (51) to equations (6) and (7), the equation of motion related to the amplitude and phase of each mode desired can be obtained.

(A. 9 Coupling Mode Equation)

First, the equation of motion related to the amplitude is as follows.

$$\dot{E}_n = a_n E_n - \sum_\mu\sum_\rho\sum_\sigma E_\mu E_\rho E_\sigma Im\{\partial_{n\mu\rho\sigma}\exp(\iota\Psi_{n\mu\rho\sigma})\} \qquad (52)$$

Here, the first term on the right hand side of equation (52) represents linear gain, and the second term represents non-linear gain saturation. Similarly, the equation of motion related to the phase can be obtained by the similar process.

$$\nu_n + \dot{\phi}_n = \Omega_n + \sigma_n - \sum_\mu\sum_\rho\sum_\sigma E_\mu E_\rho E_\sigma E_n^{-1} Re\{\partial_{n\mu\rho\sigma}\exp(\iota\Psi_{n\mu\rho\sigma})\} \qquad (53)$$

Here, the second term on the right hand side is a first order dispersion, and the third term is a nonlinear dispersion. The coefficients of equations (52) and (53) are as follows. First, the amounts representing the linear gain and dispersion are as follows.

$$a_n = \frac{\nu}{2\varepsilon_0\hbar\gamma V}\sum_k N_k(d_{cvk})^2 L(\omega_k - \nu_n)S_{nn} - \frac{1}{2}\frac{\nu}{Q_n} \qquad (54)$$

$$\sigma_n = \frac{\nu}{2\varepsilon_0\hbar\gamma V}\sum_k N_k(d_{cvk})^2\{(\omega_k - \nu_n)/\gamma\}L(\omega_k - \nu_n)S_{nn} \qquad (55)$$

In equations (54) and (55), L $(\omega_k-\nu_n)$ is a Lorentz function.

$$L(\omega_k - \nu_n) = \frac{\gamma^2}{\gamma^2 + (\omega_k - \nu_n)^2} \tag{56}$$

The coefficient for the nonlinear term is represented by the following equation.

$$\vartheta_{n\mu\rho\sigma} = \frac{W}{64\hbar^3 \varepsilon_0 V} S_{n\mu\rho\sigma} \{D_c(\nu_\rho - \nu_\sigma) + D_\sigma(\nu_\rho - \nu_\sigma)\} \times \tag{57}$$

$$\sum_k N_k (d_{cuk})^4 D(\omega_k - \nu_\mu + \nu_\rho - \nu_\sigma) \{D(\omega_k - \nu_\sigma) + D^*(\omega_k - \nu_\rho)\}$$

(A. 10 Three Modes Operation)

The conditions for ML generation and stability will be studied based on equations (52) and (53). For this purpose, it is necessary to consider at least three adjacent modes. The reason for this is that the mode lock refers to a phenomenon in which phase relation between modes is kept constant. The equations of motion of the amplitude and the phase of three modes can be given by the following equations.

$$\dot{E}_1 = E_1 \left( a_1 - \sum_{m=1}^{3} \theta_{1m} E_m^2 \right) - Im\{\vartheta_{1232} \exp(-i\Psi)\} E_2^2 E_3 \tag{58}$$

$$\dot{E}_2 = E_2 \left( a_2 - \sum_{m=1}^{3} \theta_{2m} E_m^2 \right) - Im\{(\vartheta_{2123} + \vartheta_{2321}) \exp(i\Psi)\} E_1 E_2 E_3 \tag{59}$$

$$\dot{E}_3 = E_3 \left( a_3 - \sum_{m=1}^{3} \theta_{3m} E_m^2 \right) - Im\{\vartheta_{3212} \exp(-i\Psi)\} E_2^2 E_1 \tag{60}$$

$$\nu_1 + \dot{\phi}_1 = \Omega_1 + \sigma_1 - \sum_{m=1}^{3} \tau_{1m} E_m^2 - Re\{\vartheta_{1232} \exp(-i\Psi)\} E_2^2 E_3 / E_1 \tag{61}$$

$$\nu_2 + \dot{\phi}_2 = \Omega_2 + \sigma_2 - \sum_{m=1}^{3} \tau_{2m} E_m^2 - Re\{(\vartheta_{2123} + \vartheta_{2321}) \exp(i\Psi)\} E_1 E_3 \tag{62}$$

$$\nu_3 + \dot{\phi}_3 = \Omega_3 + \sigma_3 - \sum_{m=1}^{3} \tau_{3m} E_m^2 - Re\{\vartheta_{3212} \exp(-i\Psi)\} E_2^2 E_1 / E_3 \tag{63}$$

where $$\theta_{nm} = Im(\vartheta_{nnmm} + \vartheta_{nmmn}) \tag{64}$$

$$\tau_{nm} = Re(\vartheta_{nnmm} + \vartheta_{nmmn}) \tag{65}$$

$$\Psi = \Psi_{2123} = (2\nu_2 - \nu_1 - \nu_3)t + 2\phi_2 - \phi_1 - \phi_3 \tag{66}$$

In the following, a situation is assumed, where mode 1 oscillates on the lower energy side and mode 3 oscillates on the higher energy side, with mode 2 being the center.

Let us focus the time change of the phase. By calculating the equation (62)×2−equation (63)−equation (61), the following equation results.

$$\dot{\Psi} = d + l_s \sin\Psi + l_c \cos\Psi \tag{67}$$

where detuning d is $$d = 2\sigma_2 - \sigma_1 - \sigma_3 - \sum_{m=1}^{3} (2\tau_{2m} - \tau_{1m} - \tau_{3m}) E_m^2 \tag{68}$$

and mode lock coefficients $l_s$ and $l_c$ are as follows.

$$l_s = Im\left\{ 2E_1 E_3 (\vartheta_{2123} + \vartheta_{2321}) + \left( \frac{\vartheta_{1232} E_3}{E_1} + \frac{\vartheta_{3212} E_1}{E_3} \right) E_2^2 \right\} \tag{69}$$

$$l_c = Re\left\{ -2E_1 E_3 (\vartheta_{2123} + \vartheta_{2321}) + \left( \frac{\vartheta_{1232} E_3}{E_1} + \frac{\vartheta_{3212} E_1}{E_3} \right) E_2^2 \right\} \tag{70}$$

The equation (67) can further be simplified to $$\dot{\Psi} = d + l \sin(\Psi - \Psi_0) \tag{71}$$

where $$l = l_s \left( 1 + \frac{l_c^2}{l_s^2} \right)^{1/2} \tag{72}$$

$$\Psi_0 = -\tan^{-1}(l_c/l_s) \tag{73}$$

Equations (58), (59), (60) and (71) determine the three modes motion. Mode lock appears when the following relation is satisfied.

$$\dot{\Psi} = 0 \tag{74}$$

Namely, by the definition (48) of $\Psi$, there is the following relation $$\nu_2 - \nu_1 = \nu_3 - \nu_2 \equiv \Delta \tag{75}$$

and therefore, a relation is determined between phases $\phi_1$, $\phi_2$ and $\phi_3$.

By assuming that $E_n$ is not dependent on time, the equation (71) can be considered to be independent of equations (58), (59) and (60). Further, in order for the equation (71) to have a stationary solution, the following is necessary. (Condition of mode lock generation).

$$|d| < |l| \tag{76}$$

The condition of stability of the state where $$\dot{\Psi} = 0 \tag{c}$$

will be studied. Now, the solution of equation (74) is represented by $\Psi^{(s)}$, and $\in$ is assumed to be a slight variation of $\Psi$ from the stable state.

By substituting the following equation $$\Psi = \Psi^{(s)} + \in \tag{77}$$

to the equation (71), and neglecting higher order terms of second or higher of $\in$, the following equation results.

$$\dot{\in} = \in l \cos(\Psi^{(s)} - \Psi_0) \tag{78}$$

By integrating this equation, $$\in = \exp\{tl \cos(\Psi^{(s)} - \Psi_0)\} \tag{79}$$

Accordingly, if the following relation is satisfied, $$l \cos(\Psi^{(s)} - \Psi_0) < 0 \tag{80}$$

then, $\in \to 0$, when $t \to \infty$ (condition of mode lock stabilization). The object of this section is to obtain quantitative evaluation of the condition (76) of mode lock generation and condition (80) of stabilization, for the actual semiconductor laser.

First, the condition for mode lock stabilization will be further broken down. When the equation (74) holds, the equation (71) has the following solutions.

$$\Psi^{(s)} = \Psi_0 - \sin^{-1}(d/l) \quad (81)$$

$$= \Psi_0 \pm \pi + \sin^{-1}(d/l) \quad (82)$$

When the equation (81) holds, the following equation results if the time origin is taken so that $\phi_1 = \phi_2$.

$$\phi_1 = \phi_2 = -\sin^{-1}(d/l) + \phi_3 \quad (84)$$

Now, where $$\sin^{-1}(d/l) \to 0 \quad (85)$$

namely, $$d/l \to 0 \quad (86)$$

then, three modes come to have the same phase, and mode lock is obtained in which all the modes are superposed in phase. In this case, there is the following relation $$\cos(\Psi^{(s)} - \Psi_0) > 0$$

and therefore condition (80) will be represented as $$l < 0 \quad (87)$$

and similarly, $$l_s < 0 \quad (88)$$

This is the condition for amplitude mode lock generation.

On the other hand, when the condition (82) is satisfied, the phase relation can be represented by $$\phi_1 = \phi_2 = \pm \pi + \sin^{-1}(d/l) + \phi_3 \quad (89)$$

In this case, if the equation (85) holds, then modes 1 and 2 oscillate in phase, while mode 3 oscillates of phase. Therefore, the signal intensity of the mode locked pulse becomes smaller. Here, as $\cos(\Psi^{(s)} - \Psi_0) < 0$, the condition (80) can be represented as $l_s > 0$. This is the condition of FMML generation.

Until the condition (76) of mode locked generation and either one of the condition (88) i.e. AMML and condition ($l_s > 0$) i.e. FMML are satisfied, the phase of each mode of the laser fluctuates. Once any of the conditions is satisfied, oscillation is maintained stably at that point. Generally, in a laser having the Fabry-Perot structure oscillating in multimode, it is the case that the oscillation is either in AM or FM state. Therefore, the object here is to find the condition of AM mode lock generation (that is, the condition to satisfy $|d/l| < 1$, $l < 0$).

(A. 11 Rate Equation of Carriers in Quantum Well)

The rate equation of carriers in the quantum well can be derived in the following manner from the equation (33). By summing Eq (33) with respect to k and dividing the sum by the volume of the quantum well, the following equation results.

$$\dot{n}_{2D} = \Xi_c - \gamma_c n_c - \frac{1}{4V} \sum_k \left(\frac{d_{cuk}}{\hbar}\right)^2 N_k \times \quad (90)$$

$$\sum_\rho \sum_\sigma E_\rho E_\sigma Z_\rho^* Z_\sigma Y_\rho^* Y_\sigma D(\omega_k - \nu_\sigma) \times$$

$$\exp[i\{(\nu_\rho - \nu_\sigma)t + \phi_\rho - \phi_\sigma\}] + c.c.$$

The third term on the right hand side of the equation (90) represents decay rates due to stimulated emissions. The term is obviously time- and space-dependent. In actual calculations, however, the field and carrier density are assumed to be homogenous in the resonator and have values averaged in time and space. Consequently, stimulated emission rates become homogenous as well. Further, in this embodiment, we consider two cases only. One is that the gain region occupies whole resonator and the other is that the gain region is restricted in length to one half of the resonator and is placed in just the middle of the resonator. For both cases, terms that include different indices vanish by the averaging procedure because of the orthogonality of the function $Z(z)$. As a result, the fast time variation of the third term also disappears. This approximation corresponds to the approximation (SVA approximation) that the amplitude hardly varies in the round trip time of light in the resonator. In a quantum well in which $n_{2D}$ is defined, the electric field of light can be considered almost constant, and therefore, averaging of the electric field of light in the y direction within the quantum well may be a good approximation. By rewriting the equation (90) using equation (38), the following equation is obtained.

$$\dot{n}_{2D} = \Xi_c - \gamma_c n_{2D} - \frac{1}{2V\gamma} \sum_\rho S_\rho^z S_\rho^y E_\rho^2 \sum_k N_k \left(\frac{d_{cuk}}{\hbar}\right)^2 L(\omega_k - \nu_\rho) \quad (91)$$

where $$S_\rho^z = \frac{1}{L} \int S^z(z) Z_\rho^2 dz \quad (92)$$

$$S_\rho^y = \frac{1}{L_{well}} \int S^y(y) Y_\rho^2 dy \quad (93)$$

In equation (91), $\Xi_c$ represents the excitation rate of carriers to the active section. This amount is determined, microscopically, by transportation of three-dimensional carriers $n_{3D}$.

(A. 12 Transportation of Three Dimensional Carriers $n_{3D}$)

Transportation of three dimensional carrier $n_{3D}$ is governed by the following Poisson equation and the continuity equation.

$$div(\in grad\phi) = -\rho(y) \quad (94)$$

$$\dot{n}_{3D} + div J^c = -G \quad (95)$$

In equation (94), $\rho(y)$ represents spatial distribution of charges. In equation (95), G is a term representing generation and annihilation of carriers that realize the thermal equilibrium. In the quantum well section, 3D carriers transported in accordance with the above equations will be scattered to 2D states and confined. Conversely, 2D carriers are also scattered to 3D carriers at a certain probability, escaping from confinement state. Calculation of these two scattering probabilities is itself a significant problem. Here, respective probabilities will be represented by two times, that is, trap time $\tau_{trap}$ and escape time $\tau_{escape}$. Therefore, equations (91) and (95) in the quantum well section will be $$\dot{n}_{2D} = -n_{2D}/\tau_{escape} + n_{3D}/\tau_{trap} - \gamma_c n_{2D} - \qquad (96)$$

$$\frac{1}{2V\gamma}\sum_{p} S_p^z S_p^y E_p^2 \sum_{k} N_k \left(\frac{d_{cuk}}{\hbar}\right)^2 L(\omega_k - \nu_p)$$

$$\dot{n}_{3D} + div J^c = -G + n_{2D}/\tau_{escape} - n_{3D}/\tau_{trap} \qquad (97)$$

The current in accordance with the drift diffusion model can be represented by $$J^c = -n\mu^c \mathrm{grad}(-\phi + V^c) - D^{grad\ n} \qquad (98)$$

In the equation (98) of current, D represents a diffusion coefficient, and it is assumed here that Einstein relation $D = \mu kT/q$ is satisfied. Further, in the present embodiment, the charge of an electron is considered to be $-1$. Though expressions related to electrons have so far been given, similar expressions hold with respect to the holes.

In the following, equations (58) to (63) of motion of the amplitude and phase of three modes and the continuity equations (96) and (97) of the electronic system as well as the slow variation of electric field (94) will be numerically solved simultaneously, so as to find conditions (87), (86) for stable generation of AMML.

(B. Calculation)
(B. 1 Model)
Laser Structure Assumed for Calculation

The laser assumed for calculation has an SCH structure of single quantum well, consisting of an InGaAsP/InP heterojunction structure, lattice-matched with an InP substrate (see Table 1). It oscillates at a wavelength in a 1.55 μm band. We use values of material constants such as bandgap energies that appear in G. P. Agrawal and N. K. Dutta, *Long-Wavelength Semiconductor Lasers*, (Van Norstrand Reinhold Company, N.Y., 1986).

TABLE 1

Laser Structure Assumed for Calculation

|  | P clad | pSCH | pSCH | Quantum well | nSCH | nSCH | n clad |
|---|---|---|---|---|---|---|---|
| Layer thickness (nm) | 100 | 60 | 30 | 6 | 30 | 60 | 100 |
| Arsenic composition | 0 | 0.6431 | 0.6431 | 1 | 0.6431 | 0.6431 | 0 |
| Donner concentration ($cm^{-3}$) | $5 \times 10^{15}$ | $5 \times 10^{15}$ | $5 \times 10^{15}$ | $5 \times 10^{15}$ | $1 \times 10^{17}$ | $5 \times 10^{17}$ | $1 \times 10^{18}$ |
| Acceptor Concentration($cm^{-3}$) | $1 \times 10^{18}$ | $5 \times 10^{17}$ | $3 \times 10^{17}$ | $3 \times 10^{17}$ | $2 \times 10^{17}$ | $1 \times 10^{17}$ | $5 \times 10^{16}$ |

Parameter Values Used for Calculation

Among the parameters having direct influence on the mode lock condition, phase relaxation constant γ is assumed to have a constant value 30 ($ps^{-1}$) in this calculation. (W. W. Chow, A. Knorr, S. Hughes, A. Girndt, and S. W. Koch, IEEE J. Selected Topics in Quantum Electron., 3, 136 (1997)). Carrier density, $n_{2D}$, $\gamma_c$ and so on vary with the operation condition. The value $\gamma_c$ is assumed to be given by the following equation, using spontaneous emission coefficient B.

$$\gamma_c = B(n_{2D} p_{2D})^{1/2} \qquad (d)$$

The value $\tau_{cap}$ used for the calculation was 0.1 ps. The value $\tau_{escape}$ for the electrons and holes were 0.167 ps and 0.128 ps, respectively. These values were selected such that the spectra observed in the experiment could be reproduced by changing the applied voltage (see FIGS. 7A to 7D). The values are listed in Table 2 below.

TABLE 2

Parameter Values Used for Calculation

| | |
|---|---|
| $\tau_{cap}$(ps) | 0.1 |
| $\tau_{esc}$ (electron) (ps) | 0.167 |
| $\tau_{esc}$ (hole) (ps) | 0.128 |
| γ ($ps^{-1}$) | 30 |
| natural radiation coefficient | 0.04 |
| B ($nm^3$/ps) | |
| internal loss ($cm^{-1}$) | 20 |

(B. 2 Example of Typical Results of Calculation)

Figure 3:
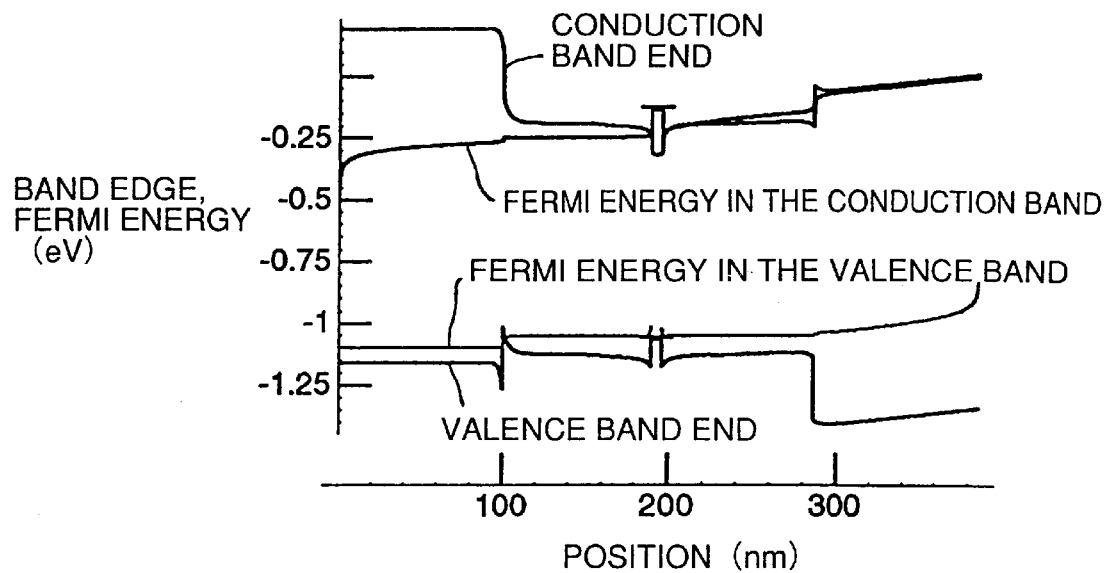
FIG. 3 is a graph representing spatial distribution of potential and quasi-Fermi energy in an active section, in the second embodiment of the present invention.
Figure 4:
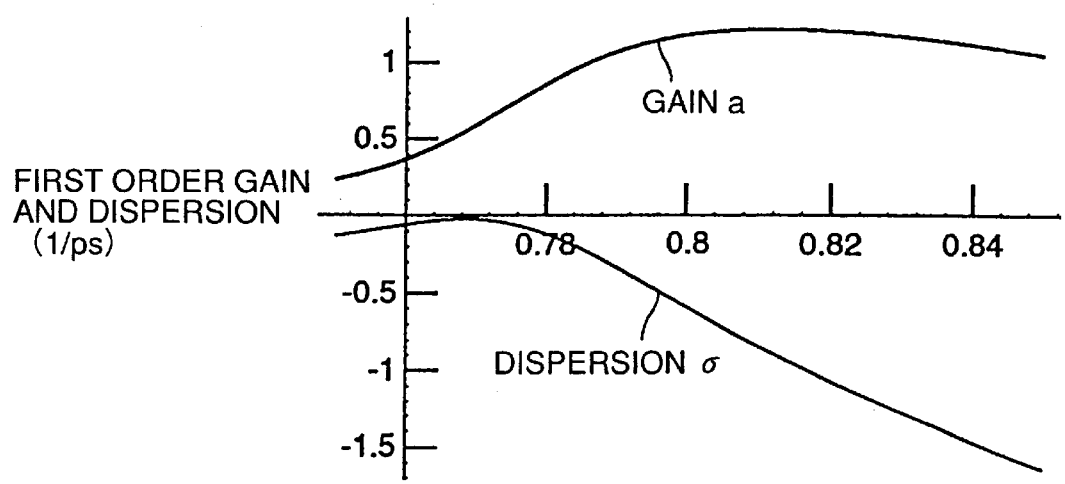
FIG. 4 is a graph representing first order gain and dispersion spectra.
Figure 5:
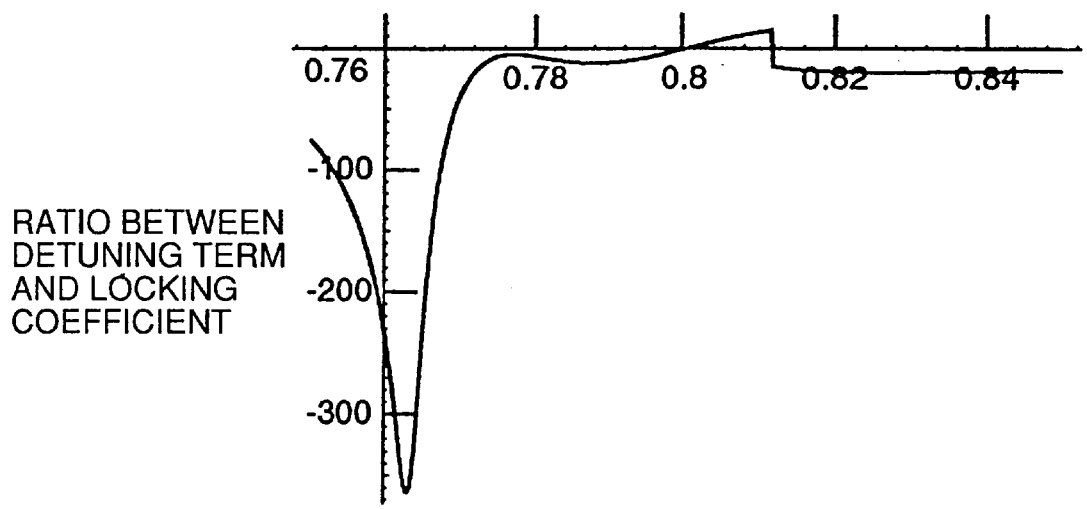
FIG. 5 is a graph representing a spectrum of the ratio d/l of a detuning term and a locking coefficient, in accordance with the second embodiment of the present invention.

FIGS. 3 to 6 show examples of numerical solutions of the equation systems (58) to (63), (96), (97) and (94) for the laser with a 300 μm length when applied voltage is 1.1V. FIG. 3 represents spatial distribution of potential and quasi-Fermi energy in the gain section. The carrier density in the quantum well at this time is $\sqrt{(np)} = 5.25 \times 10^{18}$ $cm^{-3}$. FIG. 4 shows spectra of first order gain and dispersion. FIG. 5 represents a spectrum of the ratio d/l of the detuning term to the locking coefficient. It is clearly seen that $|d/l| < 1$ is attained near 0.8007 eV. When the laser oscillates within the spectrum range of $|d/l| < 1$, time variation of the amplitude and phase becomes small, and hence oscillation becomes steady. In the numerical solution, the laser oscillates at $$\nu_2 \hbar = 0.8007\ eV \qquad (e)$$

Figure 6:
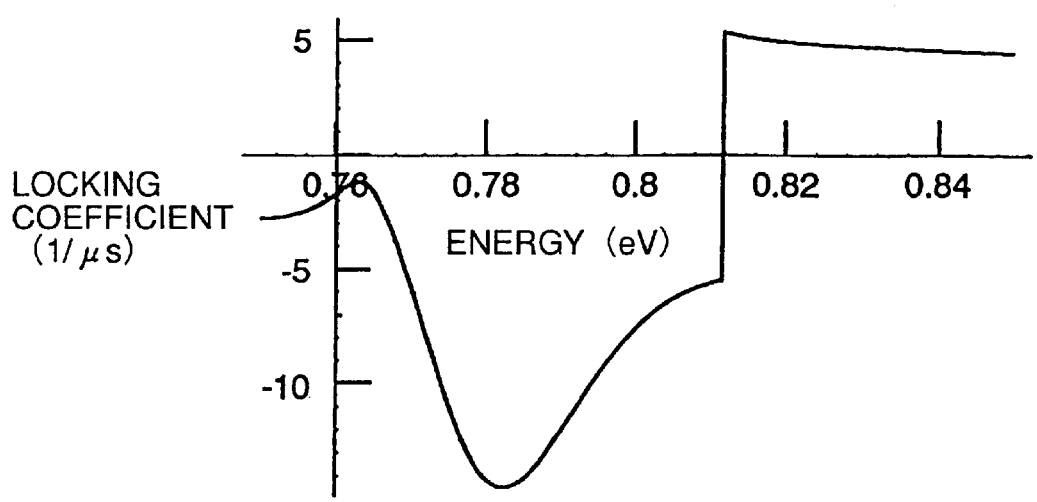
FIG. 6 is a graph representing a spectrum of locking coefficient l, in accordance with the second embodiment of the present invention.

The amplitude near this energy can be considered constant. Therefore, using the amplitude at $$\nu_2 \hbar = 0.8007\ eV \qquad (f)$$

the spectrum of $|d/l|$ is drawn, which is FIG. 5 ("decoupled approximation"). FIG. 6 shows a spectrum of the locking coefficient of l. This spectrum is also correct near 0.8007 eV quantatively. At the oscillation energy, $$\nu_2 \hbar = 0.8007\ eV \qquad (g)$$

the condition $|d/l| < 1$ and $l < 0$ is satisfied. More specifically, with this solution (oscillation energy and FIGS. 3 to 6), AMML is generated.

The curves of FIGS. 5 and 6 obtained under "decoupled approximation" are meaningful. The spectrum range satisfying $|d/l| < 1$ is narrow, and hence, the assumption that the amplitude does not vary significantly in that spectral range may be adequate. Further, the aim of FIG. 6 is to show the range where $l < 0$ and it is clear from the expression (69) that whether l is positive or negative does not depend on the amplitude.

FIG. 7B represents spectrum of three modes obtained as a result of calculation. FIG. 7A represents the spectrum when the semiconductor laser having the resonator length of 300 μm was pulse-driven with the current density of 41 kA/cm². As will be described later, a clear AMML pulse was observed in the experiment. FIGS. 7C and 7D are spectra representing the result of experiment (20.5 kA/cm²) of the laser having the resonator length of 600 μm and the result of calculation. The value $\tau_{esc}$ of Table 2 was selected so that the central frequencies of FIGS. 7A and 7C can be covered by selecting the applied voltage $V_B$ in calculation.

(B. 3 Condition to obtain AMML: Condition for Resonator Length (Mode Interval) and Carrier Density)

FIGS. 8A to 8D show the spectral ranges satisfying relations |d/l|<1 and l<0 as functions of carrier density for lasers with cavity length of 300, 400, 500 and 600 μm. The relation is obtained based on the solutions of the equation systems (58) to (63), (96), (97) and (94) when $V_B$ is varied from 0.79V to 1.1V. When the resonator length is within the range of 300 to 500 μm, the spectrum range satisfying |d/l|<1 for each carrier density is almost covered by the spectrum range where l<0, and hence AMML can be obtained. When the resonator length is 600 μm, the spectrum range satisfying |d/l|<1 is separated from the spectrum range satisfying l<0, when the carrier density increases. In that case, oscillation will be FMML.

In this manner, the condition to obtain AMML depends on the carrier density and the resonator length (mode interval). When the resonator length increases, it becomes more difficult to obtain AMML. When the carrier density increases, it becomes more difficult to obtain AMML. In other words, in order to generate AMML, the following condition must be satisfied.

$$2\gamma\gamma_c - \Delta^2 < 0 \quad (99)$$

Figure 9A:
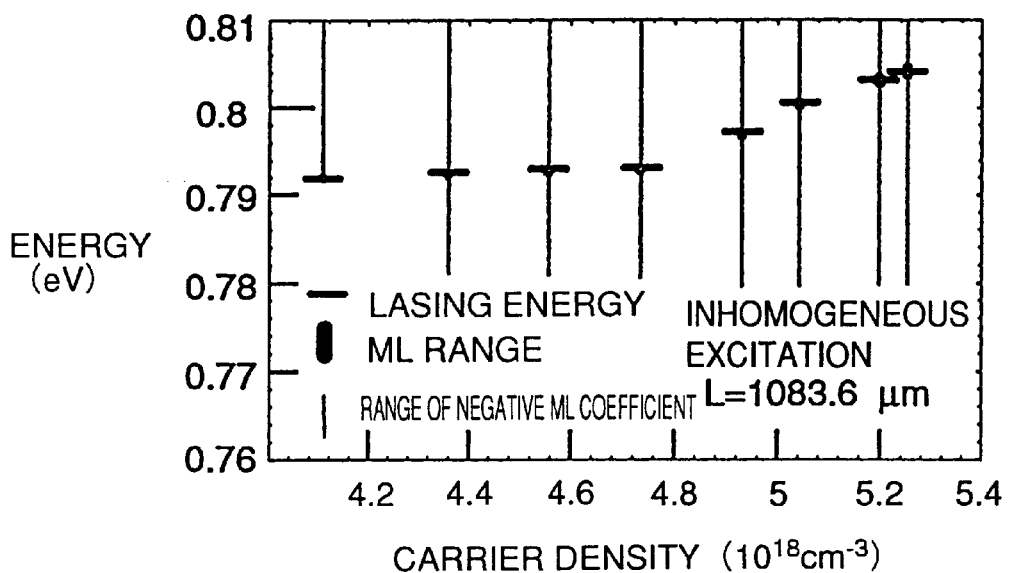
FIG. 9A is a graph showing the relation between the carrier density and the spectrum range where relations $|d/l|<1$ and $l<0$ are satisfied for a 1083.6 μm cavity, in a heterogeneous excitation structure.
Figure 9B:
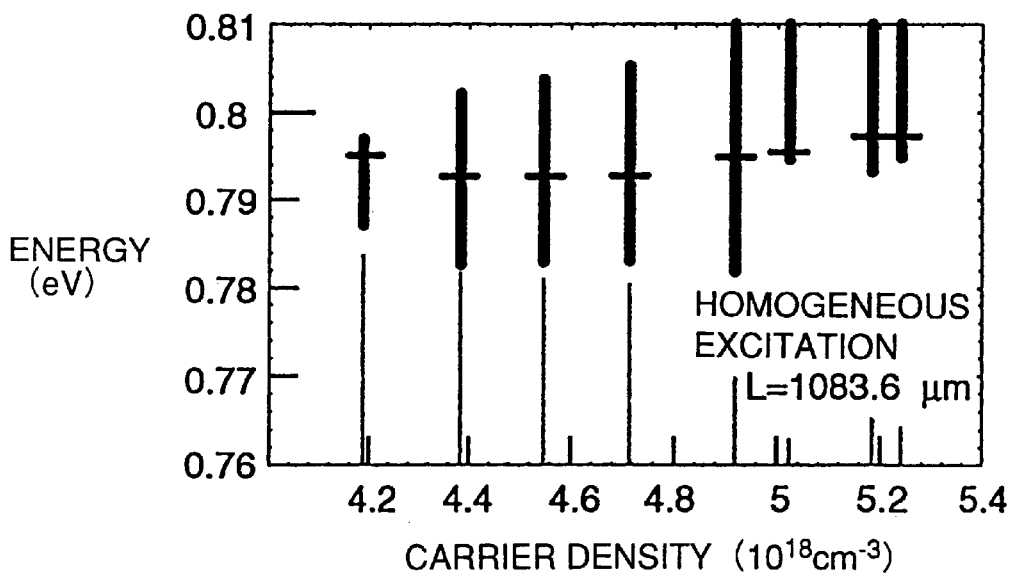
FIG. 9B is a graph showing the relation between the carrier density and the spectrum range where relations $|d/l|<1$ and $l<0$ are satisfied for a 1083.6 μm cavity, in a homogenous excitation structure.

This is an empirical rule obtained through simulations. Further, the inequality (99) is a necessary condition and not a sufficient condition. By numerical calculation, when the resonator length is further increased to 1083.6 μm, only the FMML is obtained, as shown in FIG. 9B. However, for this cavity length, AMML can take place again, as shown in FIG. 9A, by restricting the excitation region to a part of middle of the cavity (resonator) as shown in FIG. 2. Excitation of the prescribed section only of the resonator in this manner will be hereinafter referred to as "inhomogeneous excitation."

Recovery of AMML described above by inhomogeneous excitation can be understood from the equation (69). The coefficients included in $1_s$ are limited to $Im\theta_{2123}$, $Im\theta_{2321}$, $Im\theta_{1232}$, and $Im\theta_{3212}$. For these suffixes, the term obtained by integrating cosine terms vanishes in the case of homogenous excitation, and therefore the equation (50) is always positive. By contrast, when only the central portion (the section of one half the length of the resonator) of the resonator is excited and other sections are kept transparent (that is, $N_k$ (y, z)=0 in these sections), integrations of two cosine terms added to each other come to have a negative value of which absolute value is larger than 1, and therefore, the value of equation (50) is always negative. Therefore, when FMML occurs by homogenous excitation of the entire resonator of the FP laser, AMML can be obtained without fail when only the central portion (the section one half the length of the resonator) of the resonator is excited.

In the description above, the section without gain is considered as a transparent section. The portion may have slight absorption (that is, $N_k(y, z) \leq 0$ in this section), and the effect is the same, in the sense that AMML is obtained.

Figure 8A:
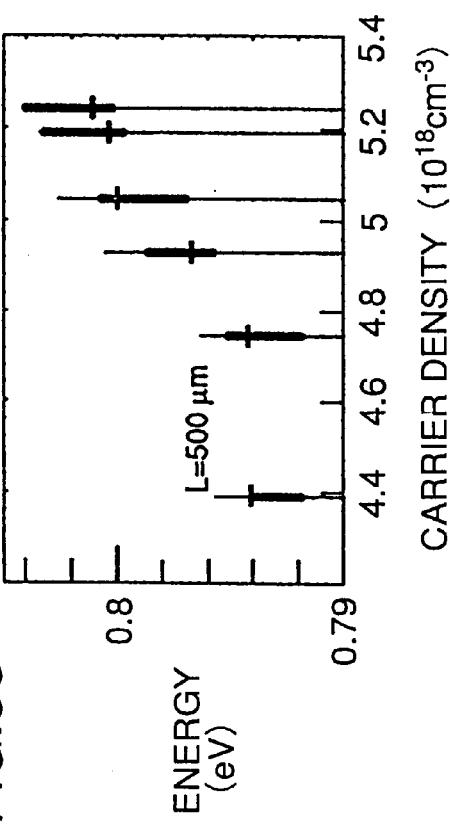
FIG. 8A is a graph showing the relation between the carrier density and spectral ranges where relations $|d/l|<1$ and $l<0$ are satisfied for a 300 μm cavity.
Figure 8B:
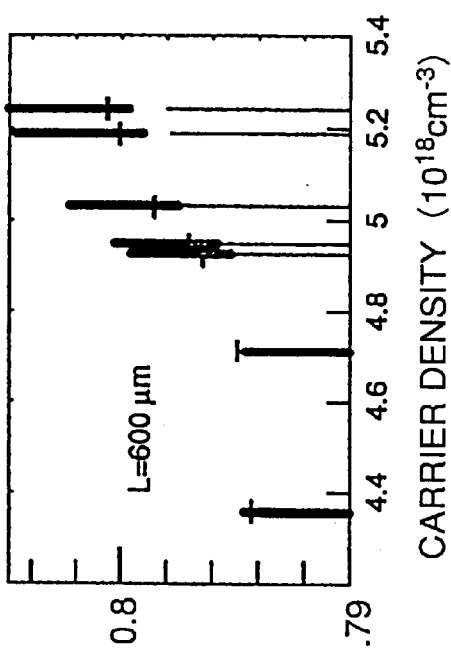
FIG. 8B is a graph showing the relation between the carrier density and spectrum ranges where relations $|d/l|<1$ and $l<0$ are satisfied for a 400 μm cavity.
Figure 8C:
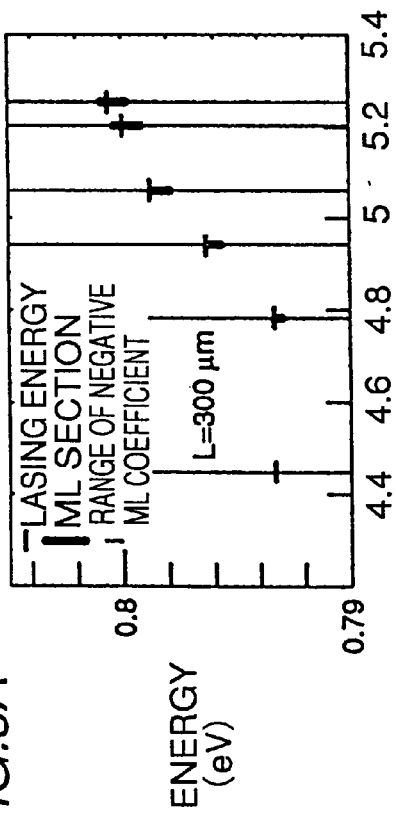
FIG. 8C is a graph showing the relation between the carrier density and spectrum ranges where relations $|d/l|<1$ and $l<0$ are satisfied for a 500 μm cavity.
Figure 8D:
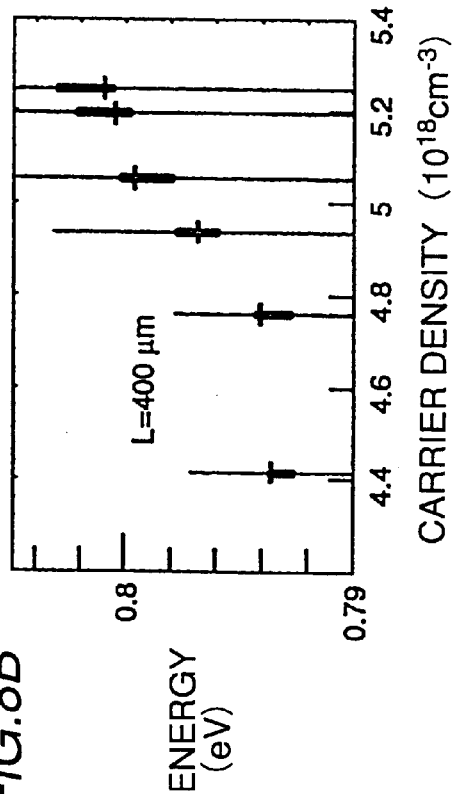
FIG. 8D is a graph showing the relation between the carrier density and spectrum ranges where relations $|d/l|<1$ and $l<0$ are satisfied for a 600 μm cavity.

What should be noted from FIGS. 8A and 8B for the case of the resonator length of 300 and 400 μm, in which the AMML condition can be satisfied in a wide spectrum range is that the spectral range satisfying |d/l|<1 becomes wider, as the carrier density (and hence amplitude) increases. This is because the mode lock coefficient $1_s$ increases as the amplitude increases, while the detuning of the linear dispersion is independent of the amplitude. It is possible that mode locking oscillation occurs in the wide range, in that case, it is expected that the time width of the mode locked pulse gradually becomes shorter. This is observed in the experiment.

Further, the magnitude of |d/l| corresponds to the phase difference (84) between the modes, and therefore, it is expected that the phase difference decreases as the carrier density increases. This contribute to improvement of extinction ratio of the mode locked optical pulse.

(B. 4 Mode Interval)

The carrier density dependency of mode interval obtained as a result of calculation is plotted for respective resonator lengths, in FIGS. 10A to 10F. Generally, the mode interval increases as the carrier density increases. What is important is that the curve seems to have a peak. For example, when the resonator length is 300 μm, the peak is at $5.2 \times 10^{18}$ cm⁻³. At this peak position, it is expected that fluctuation (jitter) of repetition frequency of the beat pulse caused by fluctuation of the carrier density is minimized.

(Third Embodiment)

Figure 11:
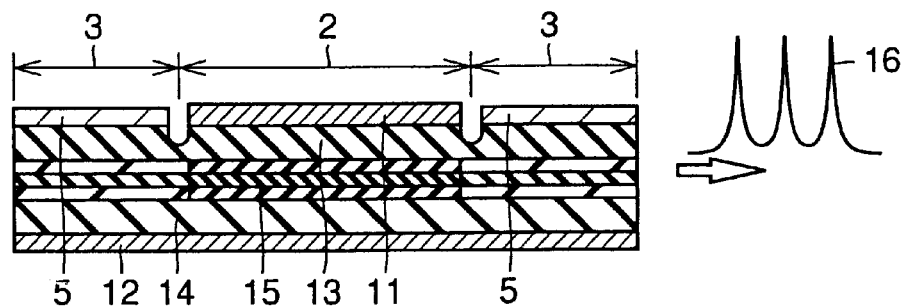
FIG. 11 is a cross sectional view of the laser apparatus in accordance with the third embodiment of the present invention.

By referring to FIG. 11, the arrangement of the laser apparatus in accordance with the third embodiment of the present invention will be described. The laser apparatus is formed basically following the arrangement of the second embodiment, except that a non-gain section electrode 5 as an electrode for injecting carriers to the non-gain section 3 is attached.

In the laser apparatus in accordance with the present embodiment, it is possible to inject carriers to the optical waveguide layer, using the non-gain section electrode 5. By the plasma effect of free carriers associated with carrier injection, index of refraction in the resonator 1 changes, and hence substantial optical path length can be controlled.

Accordingly, the repetition frequency of mode locked optical pulses 16 can be controlled.

(Fourth Embodiment)

Figure 12:
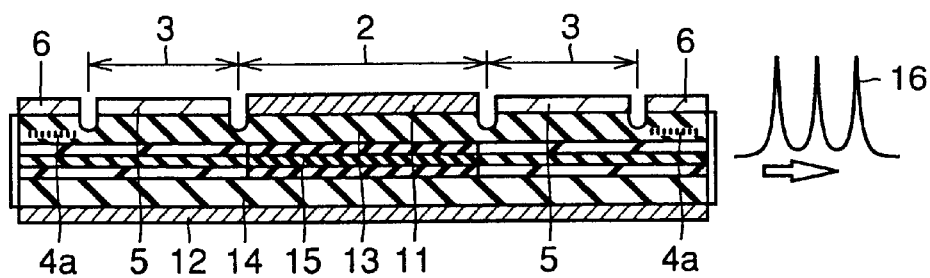
FIG. 12 is a cross sectional view of the laser apparatus in accordance with the fourth embodiment of the present invention.

By referring to FIG. 12, the arrangement of the laser apparatus in accordance with the fourth embodiment of the present invention will be described. The laser apparatus is formed basically following the arrangement of the second embodiment, except that reflection mirrors 4 are not simple mirrors but distributed Bragg reflectors 4a, consisting of a diffraction grating. On the upper surface of the distributed Bragg reflector, a distributed Bragg reflector electrode 6, that is an electrode for injecting carriers to the diffraction grating, is provided.

In the laser apparatus in accordance with the present embodiment, by selecting the repetition frequency of the diffraction grating 4a of the distributed Bragg reflector, it is possible to control the wavelength at which the mode locked optical pulse is obtained. Further, it is possible to make narrower the emission spectrum of the laser apparatus as needed. Further, by applying a forward or reverse bias between the distributed Bragg reflector electrode 6 and the negative electrode 12, the reflection spectrum of the diffraction grating can be changed, and therefore, the wavelength at which the mode locked optical pulse is obtained can be changed as necessary.

The change of index of refraction by providing the non-gain section electrode 5 in the non-gain section 3 including the semiconductor in the third and fourth embodiments, the function of the diffraction grating in the fourth embodiment, and the effect obtained by changing the index of refraction by carrier injection, by the provision of distributed Bragg reflector electrode 6 in the diffraction grating in the fourth embodiment will be described in the following.

When the resonator length is long, it is effective to limit the gain section to the central portion along the optical axis of the resonator, in order to attain mode locking, as described with reference to the second embodiment. The laser mode locking, on the other hand, is a phenomenon in which the Fabry-Perot mode interval becomes constant, because of the third order optical non-linearity. Therefore, it is possible that mode locking cannot be generated, when equality of respective mode separation is lost because an interface between media of different optical characteristics exist within the resonator 1. This will be studied by numerical analysis in the following.

When a semiconductor mode locked laser is operated freely, the spectrum width becomes wider as the injection current increases, and the pulse time width reaches the order of several hundreds femto seconds. (Y. Nomura et al., Technical Report of IEICE (In Japanese), LQE99-8, 45 (1999); Y. Nomura, et al., in Abstracts in The 6th International Workshop on Femtosecond Technology, Chiba, July 1999). In order to transmit the mode locked optical pulse through an optical fiber, it is necessary to make narrower the spectrum, so as to minimize the widening of the pulse time width caused by dispersion. For this purpose, it is effective to incorporate distributed Bragg reflectors 4a at opposing ends of the resonator 1.

(Calculation)

When a Fabry-Perot resonator structure is given and a white light is introduced from an incident end, well known periodic structures appear on the transmittance and reflectivity spectra. M. Born and E. Wolf, Principles of Optics, Fourth Edition (Pergamon Press, N.Y., 1970). By studying how the transmittance and reflectivity spectra differ from those of Fabry-Perot structure, when a divided gain section and transparent sections as non-gain sections are inserted into the resonator to obtain a mode locked laser of long resonator, it is possible to examine the influence of the interface of the dielectric on the mode.

For a multilayered film structure having different index of refraction, it is possible to calculate transmittance spectrum and reflectivity spectrum, by using a characteristic matrix. M. Born and E. Wolf, Principles of Optics, Fourth Edition (Pergamon Press, New York, 1970). The problem here is the transmittance and reflectivity for the waveguided light beam of the semiconductor laser. Therefore, in order to apply the characteristic matrix method to the waveguided light beam, effective index of refraction of the waveguide mode in the gain section and the transparent section should be calculated. By considering the effective index of refraction as the index of refraction of the multilayered thin film, the characteristic matrix method is applied to the waveguided light beam. This approach is justified, as the spatial dependency of the electric field of light can be separated into a component in the direction of progress and a component orthogonal thereto.

Similarly, for the DBR structure, the effective indexes of refraction for two different types of waveguide structures are calculated by solving the wave equation in advance, and the characteristic matrix is calculated, regarding the structure as the multilayered stacked structure of thin films having two different indexes of refraction.

(A. Formulation)
(A. 1 Wave Equation)

In any of the above described examples, absorption for light energy is small, and therefore, it is assumed that the index of refraction is real. The waveguided light satisfies the following wave equation.

$$\left\{-\left(\frac{\partial^2}{\partial y^2}+\frac{\partial^2}{\partial z^2}\right)+\mu_0\varepsilon_0\kappa(y)\frac{\partial^2}{\partial t^2}\right\}\varepsilon=0 \quad (100)$$

In the equation (100), $\kappa$ (y) represents a specific dielectric constant of the waveguide path structure. It is assumed that the light beam propagates in the z direction. For simplicity, it is assumed that the field is homogenous in the x direction.

(A. 2 Characteristic Matrix)

When we represent the index of refraction of the thin film consisting of a medium 2 by $n_2$ and the thickness by $h_2$, the characteristic matrix $M_2$ thereof will be represented by the following, when the light enters vertically.

$$M_2 = \begin{bmatrix} \cos\beta_2 & -\frac{1}{n_2}\sin\beta_2 \\ -in_2\sin\beta_2 & \cos\beta_2 \end{bmatrix} \quad (101)$$

where $$\beta_2 = \frac{2\pi}{\lambda}n_2h_2 \quad (102)$$

$\lambda$ represents wavelength of light in vacuum.

The characteristic matrix of stacked thin films including a large number of different media can be obtained as a product of respective characteristic matrixes.

$$M=M_2\times M_3\times M_4 \quad (103)$$

When N pairs of the stacked structure including medium 2 and medium 3 are stacked, each component of the characteristic matrix will be $$M_{11} = \left[\cos\beta_2\cos\beta_3 - \frac{n_3}{n_2}\sin\beta_2\sin\beta_3\right]u_{N-1}(a) - U_{N-2}(a) \quad (104)$$

$$M_{12} = -i\left[\frac{1}{n_3}\cos\beta_2\sin\beta_3 + \frac{1}{n_2}\sin\beta_2\cos\beta_3\right]u_{N-1}(a)$$

$$M_{21} = -i[n_3\cos\beta_2\sin\beta_3 + n_2\sin\beta_2\cos\beta_3]u_{N-1}(a)$$

$$M_{22} = \left[\cos\beta_2\cos\beta_3 - \frac{n_2}{n_3}\sin\beta_2\sin\beta_3\right]u_{N-1}(a) - U_{N-2}(a)$$

$$a = \cos\beta_2\cos\beta_3 - \frac{1}{2}\left(\frac{n_2}{n_3}+\frac{n_3}{n_2}\right)\sin\beta_2\sin\beta_3 \quad (105)$$

Here, $U_N$ (a) is a Chebyshev polynominal of the second kind, and therefore, $$U_N(a) = \begin{cases} \dfrac{\sin[(N+1)\cos^{-1}a]}{\sqrt{1-a^2}} & (-1<a<1) \\ \dfrac{\left(a-\sqrt{a^2-1}\right)^{N+1}-\left(a+\sqrt{a^2-1}\right)^{N+1}}{2\sqrt{a^2-1}} & (a<-1) \end{cases} \quad (106)$$

(A. 3 Reflectivity and Transmittance)

When the following characteristic matrix is given for an arbitrary optical multilayered structure, $$M = \begin{bmatrix} m_{11} & m_{12} \\ m_{21} & m_{22} \end{bmatrix} \quad (107)$$

the reflectivity coefficient r and transmittance coefficient t can be given by $$r = \frac{(m_{11} + m_{12}n_l)n_1 - (m_{21} + m_{22}n_l)}{(m_{11} + m_{12}n_l)n_1 + (m_{21} + m_{22}n_l)} \quad (108)$$

$$t = \frac{2n_1}{(m_{11} + m_{12}n_l)n_1 + (m_{21} + m_{22}n_l)} \quad (109)$$

where, $n_1$ and $n_l$ (the suffix of the former is a numeral 1, and the suffix of the latter is a small l) represent indices of refraction of semi-infinite space in contact with opposing ends of the multilayered structure in question. The reflectivity R and the transmittance T are represented by the following.

$$R = |r|^2, T = \frac{n_l}{n_1}|t|^2 \quad (110)$$

(B. Result of Calculation)
(B. 1 Heterojunction Structure of the Device)

The laser assumed in calculation has an SCH structure of multiple quantum well consisting of InGaAsP/InP heterojunction structure, lattice-matched with an InP substrate (Table 3: A gain section), and oscillates at a wavelength of 1.55 μm band. The relation between the arsenic composition and the index of refraction described in G. P. Agrawal and N. K. Dutta, *Long-Wavelength Semiconductor Lasers*, (Van Nortstrand Reinhold Company, New York, 1986) is used. The transparent section is realized by replacing the multiple quantum well in the gain section structure with InGaAsP having the As composition of 0.6431 (Table 3: C transparent section). The DBR is provided by periodically arranging the transparent section (C) and the structure adapted to have high index of refraction layer (Table 3: B transparent section) along the axial direction of the resonator. Although it is dependent on the fabrication process, it may be easier to use the B transparent section of Table 3, as the transparent section. This case is assumed in the following calculation.

The effective indices of refraction of the sections A, B and C in the structure shown in the table calculated by solving the equation (100) are as follows: A=3.4284, B=3.4281, and C=3.4259.

(B. 2 Reflectivity-Transmittance Spectra of a Resonator Having "Gain Section (A) of 1000 μm")

Figure 13A:
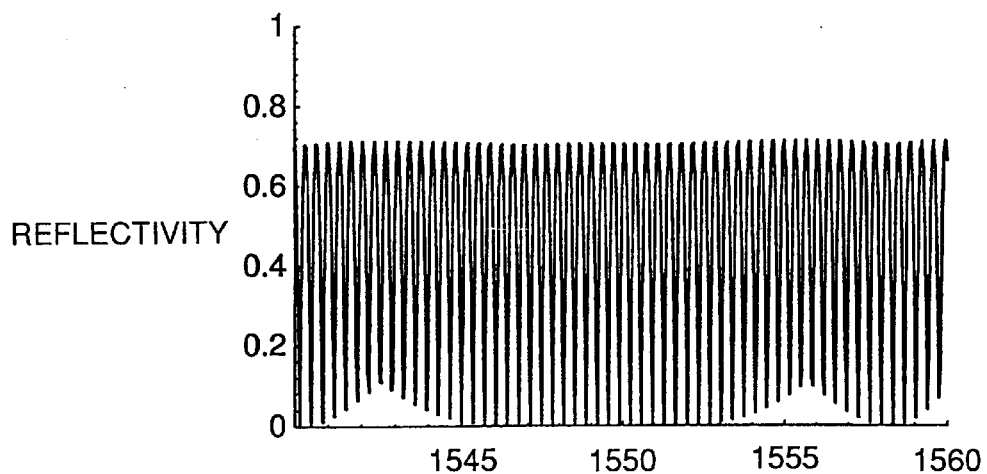
FIG. 13A is a graph representing a reflection spectrum of a resonator consisting of a gain section (Table 3: A gain section) having a length of 1000 μm.
Figure 13B:
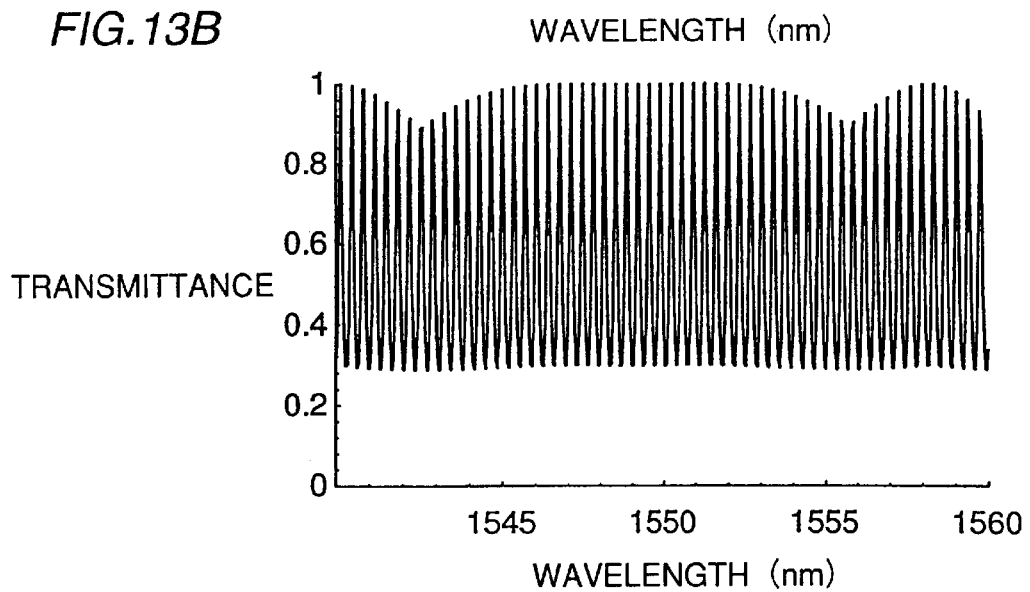
FIG. 13B is a graph representing a transmittance spectrum of a resonator consisting of a gain section (Table 3: A gain section) having a length of 1000 μm.

FIG. 13A and 13B represent the reflectivity spectrum and transmittance spectrum of the resonator having "gain section with the length of 1000 μm (Table 3: A gain section)". Near the wavelength of 1.55 μm, all the modes have approximately the same reflectivity and transmittance, respectively, representing typical spectra of the Fabry-Perot resonator. As the reflectivity spectrum and the transmittance spectrum satisfy the relation of R+T=1, only the reflectivity spectrum will be discussed in the following.

(B. 3 Reflectivity Spectrum of a Resonator Consisting of "Transparent Section (B) of 250 μm+Gain Section (A) of 500 μm+Transparent Section (B) of 250 μm")

Figure 14:
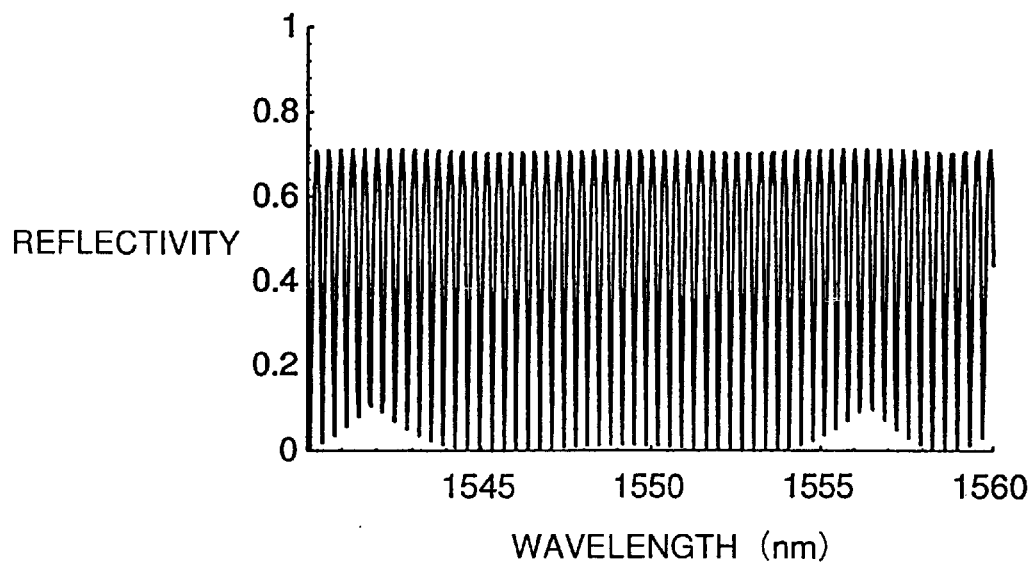
FIG. 14 is a graph representing a reflection spectrum of a resonator consisting of "transparent section (B) of 250 μm+gain section (A) of 500 μm+transparent section (B) of 250 μm."

FIG. 14 shows the reflectivity spectrum of the resonator consisting of "transparent section (B) of 250 μm+gain section (A) of 500 μm+transparent section (B) of 250 μm". Except for the difference resulting from slight difference of optical path length, the spectrum is basically the same as the reflectivity spectrum shown in FIG. 13A.

TABLE 3

Stacked Structure Considered for Calculation

| A Gain section | p-InP clad | p-InGaAsP Adapted to have high refractive index | p-InP barrier | p-InGaAsP light confinement | InGaAs quantum well 8 layers | InGaAsP barrier 7 layers | n-InGaAsP light confinement | n-InP clad |
|---|---|---|---|---|---|---|---|---|
| layer thickness (nm) | ∞ | 0 | 100 | 80 | 6 | 10 | 80 | ∞ |
| Arsenic composition | 0 | 0.6431 | 0 | 0.6431 | 1 | 0.6431 | 0.6431 | 0 |

| B transparent section adapted to have high refractive index | p-InP clad | p · InGaAsP adapted to have high refractive index | n-InP barrier | InGaAsP light confinement | n · InP clad |
|---|---|---|---|---|---|
| layer thickness (nm) | ∞ | 30 | 100 | 278 | ∞ |
| Arsenic composition | | 0 | 0.6431 | 0 | 0.6431 | 0 |

| C transparent section adapted to have high refractive index | p-InP clad | InGaAsP light confinement | n-InP clad |
|---|---|---|---|
| layer thickness (nm) | ∞ | 278 | ∞ |
| Arsenic composition | 0 | 0.6431 | 0 |

(B. 4 Reflectivity Spectrum of a Resonator Consisting of "Transparent Section (B) of 270 μm+Gain Section (A) of 500 μm+Transparent Section (B) of 250 μm")

Figure 15:
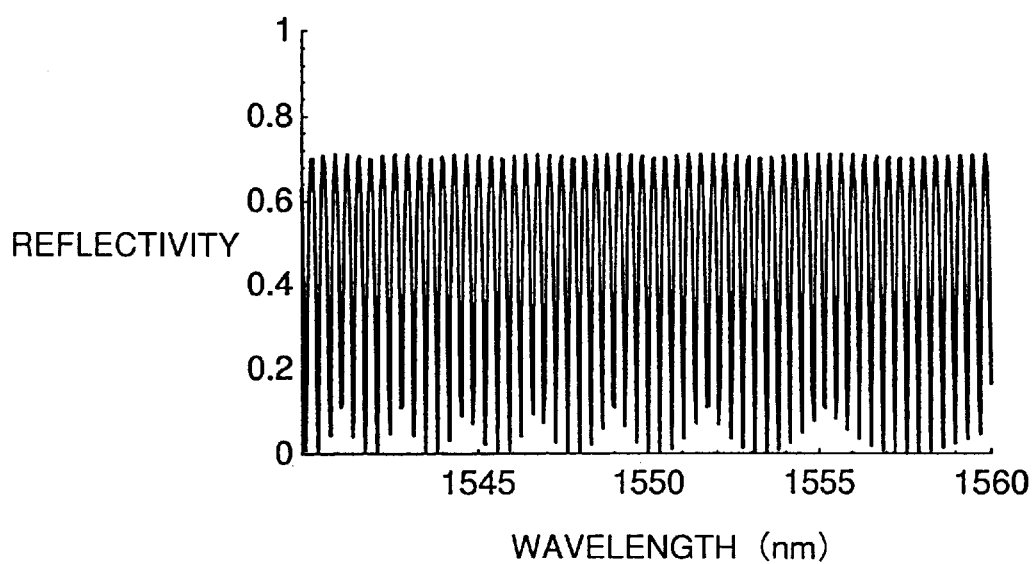
FIG. 15 is a graph representing a reflection spectrum of a resonator consisting of "transparent section (B) of 270 μm+gain section (A) of 500 μm+transparent section (B) of 250 μm."
Figure 16:
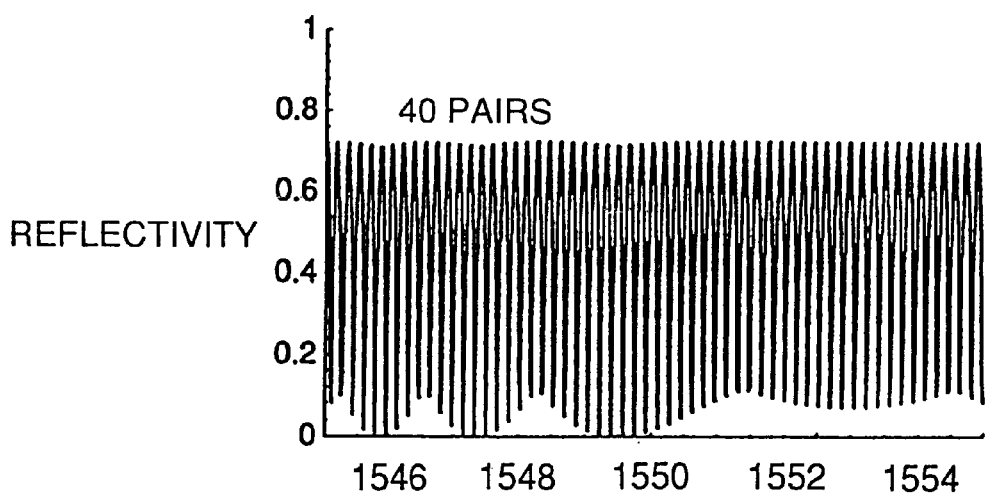
FIG. 16 is a graph representing a reflection spectrum of a resonator consisting of "DBR (Distributed Bragg Reflector) consisting of a periodic structure of transparent section (B) and transparent section (C)+transparent section (B) of 250 μm+gain section (A) of 500 μm+transparent section (B) of 250 μm", where the number of pairs of the DBR is 40.
Figure 17:
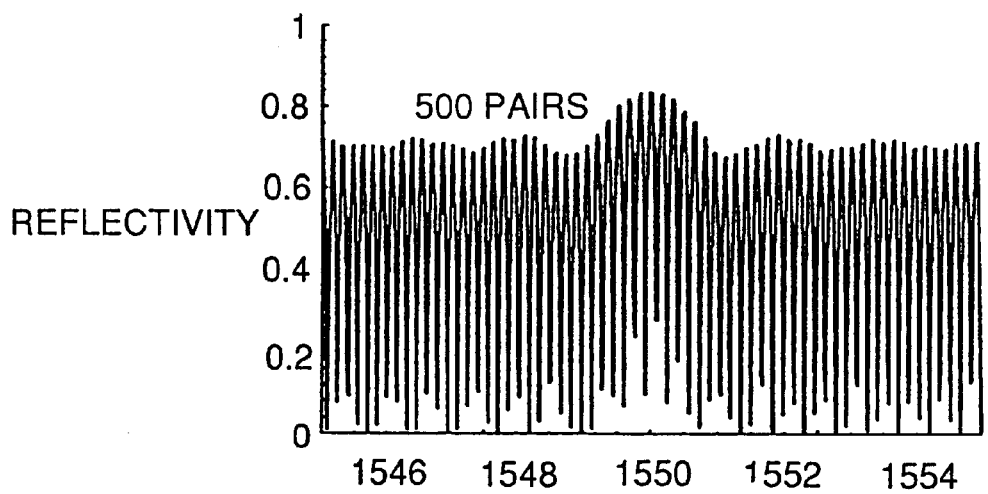
FIG. 17 is a graph representing a reflection spectrum of a resonator consisting of "DBR consisting of a periodic structure of transparent section (B) and transparent section (C)+transparent section (B) of 250 μm+gain section (A) of 500 μm+transparent section (B) of 250 μm", where the number of pairs of the DBR is 500.
Figure 18:
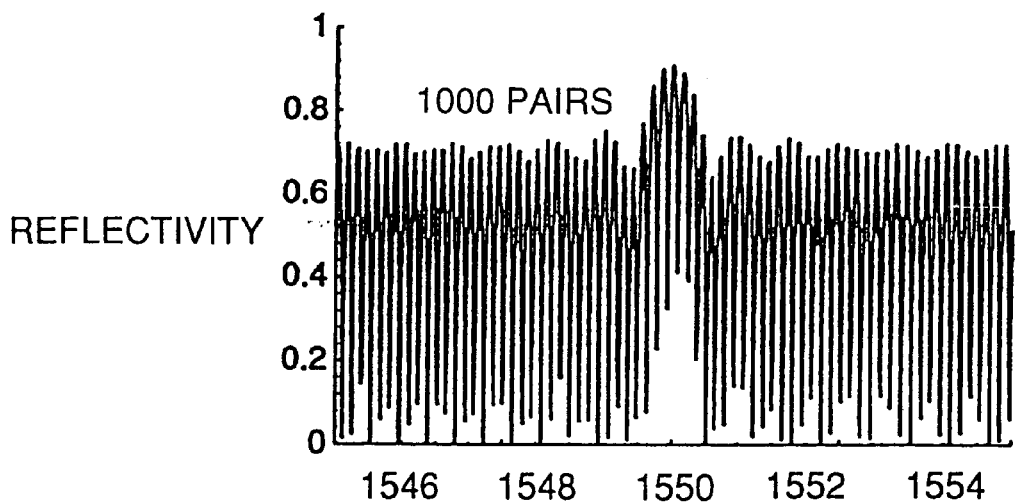
FIG. 18 is a graph representing a reflection spectrum of a resonator consisting of "DBR consisting of a periodic structure of transparent section (B) and transparent section (C)+transparent section (B) of 250 μm+gain section (A) of 500 μm+transparent section (B) of 250 μm", where the number of pairs of the DBR is 1000.

FIG. 15 shows the reflectivity spectrum of a resonator consisting of "transparent section (B) of 270 μm+gain section (A) of 500 μm+transparent section of 250 μm (B)". This corresponds to an example in which one transparent section is made longer by 20 μm than the example of FIG. 14. When a laser is fabricated, if cutting is done by cleavage, instability of the resonator length to this extent is unavoidable. From FIG. 15, it can be seen that the minimum value of reflectivity, and therefore maximum value of transmittance fluctuate by about 10%. Such fluctuation is of course undesirable. If the magnitude of fluctuation is within 10%, however, it is sufficiently smaller than the variation in reflectivity caused by DBR structure. Therefore, such fluctuation is not considered a problem.

(B. 5 Reflectivity Spectrum of a Resonator Consisting of "DBR Consisting of Periodic Structure of Transparent Section (B) and Transparent Section (C)+Transparent Section (B) of 250 μm+Gain Section (A) of 500 μm+Transparent Section (B) of 250 μm")

Figure 21:
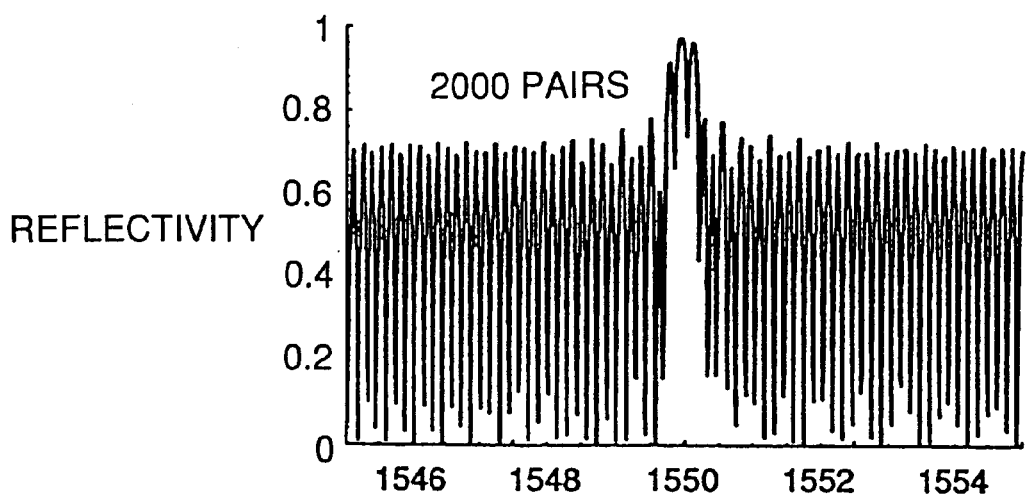
FIG. 21 is a graph representing a reflection spectrum where the number of pairs of the DBR is 2000 and the length of one transparent section is 270 μm.

FIGS. 16 to 20 represent reflectivity spectra of a resonator consisting of "DBR consisting of periodic structure of transparent section (B) and transparent section (C)+transparent section (B) of 250 μm+gain section (A) of 500 μm+transparent section (B) of 250 μm". The number of pairs in respective DBRs are (A) 40, (B) 500, (C) 1000, (D) 2000 and (E) 5000. FIG. 21 shows the reflectivity spectrum where the number of pairs in the DBR is 2000, with the length of one transparent section elongated to 270 μm.

From FIGS. 16 to 20, it can be understood that the reflectivity spectrum has a peak of which height increases gradually and the width decreases, as the number of pairs increases. Up to the pair number of 2000 pairs (see FIG. 19), the Fabry-Perot mode can be distinguished. When the number of pairs is 5000 pairs (see FIG. 20), the Fabry-Perot mode cannot be observed in the so-called stop band. Therefore, 2000 pairs is almost the upper limit of the number of pairs in which the Fabry-Perot mode can be distinguished. Here, it is expected that three Fabry-Perot modes oscillates simultaneously. Assuming that these oscillate in mode-locked manner, and the pulse width will be 4.8 ps, assuming the TL (Transfer Limit) (δtδf≦0.36).

Figure 19:
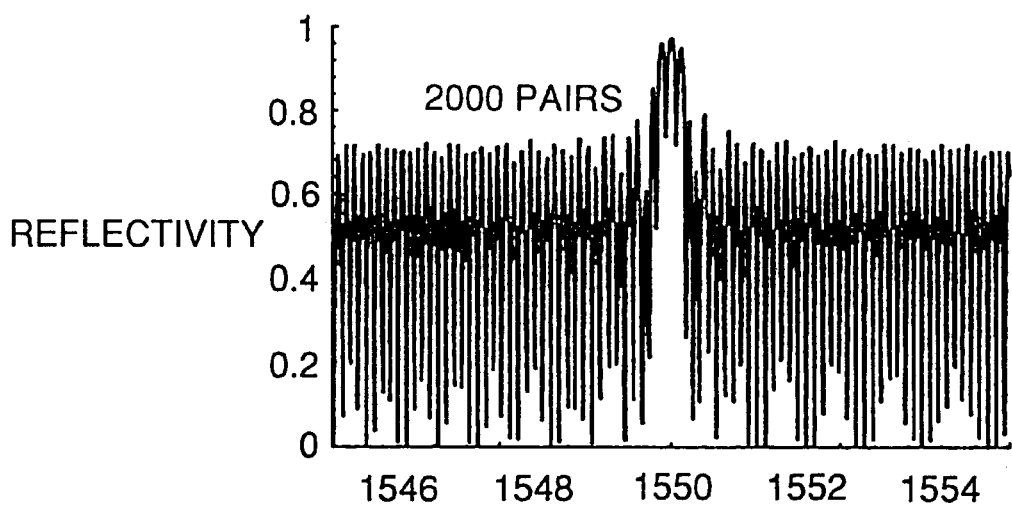
FIG. 19 is a graph representing a reflection spectrum of a resonator consisting of "DBR consisting of a periodic structure of transparent section (B) and transparent section (C)+transparent section (B) of 250 μm+gain section (A) of 500 μm+transparent section (B) of 250 μm", where the number of pairs of the DBR is 2000.
Figure 20:
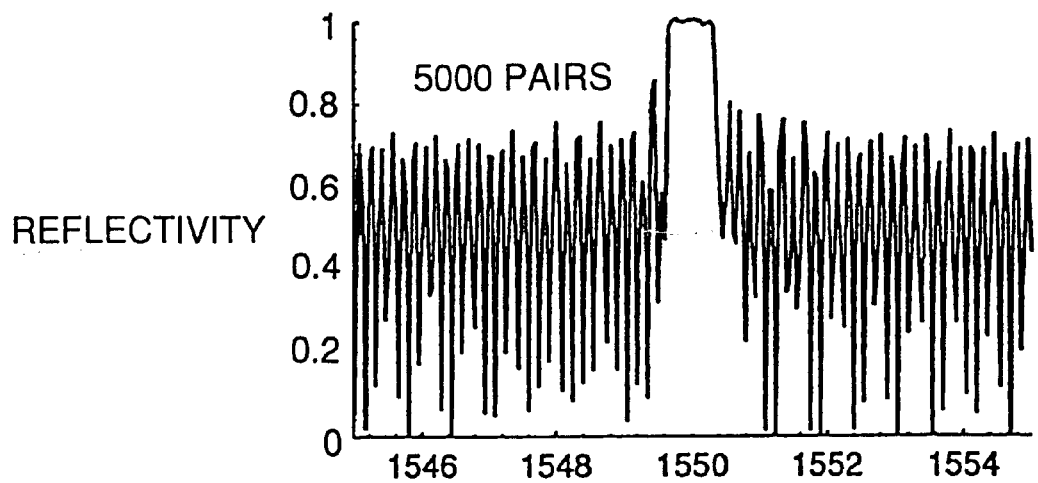
FIG. 20 is a graph representing a reflection spectrum of a resonator consisting of "DBR consisting of a periodic structure of transparent section (B) and transparent section (C)+transparent section (B) of 250 μm+gain section (A) of 500 μm+transparent section (B) of 250 μm", where the number of pairs of the DBR is 5000.

In FIG. 21, three modes have high reflectivity as in the case of FIG. 19, while the height of the reflectivity is not symmetrical. This is because the lengths of the transparent sections are asymmetrical. By injecting carriers to the transparent section, the following phase compensation is possible.

$$\delta\phi = \frac{2\pi d \delta \bar{n}}{\lambda} \quad \text{(h)}$$

where d represents the length of the section B, and $$\delta\bar{n} \quad \text{(i)}$$

represents variation in the index of refraction resulting from carrier injection. If the following variation of the index of refraction is possible by the carrier injection, perfect phase compensation is realized.

$$\delta\bar{n}=6.2\times10^{-3} \quad \text{(j)}$$

According to the present invention, as supported by the numerical analysis, even by a laser apparatus having such a resonator length that causes FMML oscillation if the entire inner portion of the resonator is used as the gain section, AMML oscillation can be obtained. Particularly, when the resonator length is long and the entire inner portion of the resonator is used as the gain section, oscillation tends to be in FMML, and therefore, the effect to obtain the AMML state by the application of the present invention is significant. By attaining the AMML state, high optical pulse can be obtained, which greatly contributes to realize ultra high speed/ultra large capacity optical transmission.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A laser apparatus comprising:

a resonator having an optical path length and including:
 a gain section in which a population inversion is produced,
 two non-gain sections in which gain with respect to laser light produced in said laser apparatus is not positive, said two non-gain sections sandwiching said gain section along the optical path length, and
 two reflection mirrors sandwiching said gain section and said two non-gain sections, wherein
 said gain section has an optical path length approximately one half the optical path length of said resonator and is centrally located within said resonator; and gain section excitation means for exciting said gain section.

2. The laser apparatus according to claim 1, wherein said gain section includes a semiconductor material and each of said non-gain sections includes a dielectric material.

3. The laser apparatus according to claim 1, wherein said gain section includes a semiconductor material and each of said non-gain sections includes a semiconductor material.

4. The laser apparatus according to claim 3, comprising respective non-gain section electrodes on said two non-gain sections for controlling refractive index of said two non-gain sections.

5. The laser apparatus according to claim 1, wherein at least one of said reflection mirrors is a distributed Bragg reflector.

6. The laser apparatus according to claim 5, further comprising a distributed Bragg reflector electrode on said distributed Bragg reflector for changing a reflectivity spectrum of said distributed Bragg reflector.

7. The laser apparatus according to claim 3, wherein said gain excitation means includes an electrode at said gain section.

8. The laser apparatus according to claim 7, comprising respective non-gain section electrodes at said two non-gain sections for controlling refractive index of said two non-gain sections.

9. The laser apparatus according to claim 8, wherein at least one of said reflection mirrors is a distributed Bragg reflector.

10. The laser apparatus according to claim 9, further comprising a distributed Bragg reflector electrode at said distributed Bragg reflector for changing a reflectivity spectrum of said distributed Bragg reflector.

11. A laser apparatus comprising:
a resonator having an optical path length and including:
 a gain section in which a population inversion is produced,
 two non-gain sections in which gain with respect to laser light produced in said laser apparatus is not positive, said two non-gain sections sandwiching said gain section along the optical path length, and
 two reflection mirrors sandwiching said gain section and said two non-gain sections, wherein
 said gain section has an optical path length in a range from eight percent to fifty percent of the optical path length of said resonator and is centrally located within said resonator; and gain section excitation means for exciting said gain section.

12. The laser apparatus according to claim 11, wherein said gain section includes a semiconductor material and each of said non-gain sections includes a dielectric material.

13. The laser apparatus according to claim 11, wherein said gain section includes a semiconductor material and each of said non-gain sections includes a semiconductor material.

14. The laser apparatus according to claim 13, comprising respective non-gain section electrodes at said two non-gain sections for controlling refractive index of said two non-gain sections.

15. The laser apparatus according to claim 13, wherein said gain excitation means includes an electrode at said gain section.

16. The laser apparatus according to claim 15, comprising respective non-gain section electrodes at said two non-gain sections for controlling refractive index of said two non-gain sections.

17. The laser apparatus according to claim 16, wherein at least one of said reflection mirrors is a distributed Bragg reflector.

18. The laser apparatus according to claim 17, further comprising a distributed Bragg reflector electrode at said distributed Bragg reflector for changing a reflectivity spectrum of said distributed Bragg reflector.

19. The laser apparatus according to claim 11, wherein at least one of said reflection mirrors is a distributed Bragg reflector.

20. The laser apparatus according to claim 19, further comprising a distributed Bragg reflector electrode at said distributed Bragg reflector for changing a reflectivity spectrum of said distributed Bragg reflector.

* * * * *

UNITED STATES PATENT AND TRADEMARK OFFICE
CERTIFICATE OF CORRECTION

PATENT NO.    : 6,614,817 B2
DATED         : September 2, 2003
INVENTOR(S)   : Nomura et al.

It is certified that error appears in the above-identified patent and that said Letters Patent is hereby corrected as shown below:

<u>Title page, Item [54] and Column 1, line 1,</u>
Title, change "LASER APPARATUS" to -- SEMICONDUCTOR LASER PRODUCING AMPLITUDE MODULATION MODE LOCKING OSCILLATION --.

Signed and Sealed this

Sixth Day of April, 2004

JON W. DUDAS
*Acting Director of the United States Patent and Trademark Office*